United States Patent
Asakawa et al.

(10) Patent No.: US 11,192,972 B2
(45) Date of Patent: Dec. 7, 2021

(54) POLYMER MATERIAL, COMPOSITION, AND METHOD OF MANUFACTURING SEMICONDUCTOR DEVICE

(71) Applicant: TOSHIBA MEMORY CORPORATION, Tokyo (JP)

(72) Inventors: Koji Asakawa, Kawasaki Kanagawa (JP); Norikatsu Sasao, Kawasaki Kanagawa (JP); Shinobu Sugimura, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/562,786

(22) Filed: Sep. 6, 2019

(65) Prior Publication Data
US 2020/0291156 A1 Sep. 17, 2020

(30) Foreign Application Priority Data
Mar. 11, 2019 (JP) ............... JP2019-044104

(51) Int. Cl.
*C08L 33/10* (2006.01)
*C08F 220/14* (2006.01)
(Continued)

(52) U.S. Cl.
CPC ............ *C08F 220/14* (2013.01); *C08L 33/10* (2013.01); *G03F 7/038* (2013.01); *G03F 7/039* (2013.01);
(Continued)

(58) Field of Classification Search
CPC ............... B22D 11/0605; C08F 220/14; C08F 220/301; C08F 220/325; C08F 120/30;
(Continued)

(56) References Cited

U.S. PATENT DOCUMENTS 9,177,818 B2 11/2015 Hieno et al.
9,487,600 B2 11/2016 Darling et al.
(Continued)

FOREIGN PATENT DOCUMENTS

CN 101387714 A 3/2009
CN 104210046 A 12/2014
(Continued)

OTHER PUBLICATIONS

Asakawa et al., "Absorption mechanism of metal precursors in resist polymer for improving etch resistance," Microprocess and Nanotechnology Conference, 15A-4-3, 2 pages (2018).
(Continued)

*Primary Examiner* — Lan Vinh
(74) *Attorney, Agent, or Firm* — Finnegan, Henderson, Farabow, Garrett & Dunner L.L.P.

(57) ABSTRACT

According to one embodiment, a polymer material is disclosed. The polymer material contains a polymer. The polymer contains a first monomer unit having a lone pair and an aromatic ring at a side chain, and a second monomer unit including a crosslinking group at a terminal of the side chain, with its molar ratio of 0.5 mol % to 10 mol % to all monomer units in the polymer. The polymer material can be used for manufacturing a composite film as a mask pattern for processing a target film on a substrate. The composite film can be formed by a process including, forming an organic film on the target film with the polymer material, patterning the organic film, and forming the composite film by impregnating a metal compound into the patterned organic film.

10 Claims, 3 Drawing Sheets

(51) Int. Cl.

| | |
|---|---|
| *G03F 7/038* | (2006.01) |
| *G03F 7/039* | (2006.01) |
| *H01L 21/027* | (2006.01) |
| *H01L 21/311* | (2006.01) |
| *H01L 27/11582* | (2017.01) |
| *G03F 7/16* | (2006.01) |
| *G03F 7/20* | (2006.01) |
| *H01L 27/11556* | (2017.01) |

(52) U.S. Cl.
CPC .... *H01L 21/0273* (2013.01); *H01L 21/31116* (2013.01); *H01L 21/31144* (2013.01); *C08L 2203/20* (2013.01); *G03F 7/162* (2013.01); *G03F 7/168* (2013.01); *G03F 7/2006* (2013.01); *H01L 27/11556* (2013.01); *H01L 27/11582* (2013.01)

(58) Field of Classification Search
CPC .... C08F 120/18; C08L 2203/20; C08L 33/10; G03F 7/038; G03F 7/039; G03F 7/094; G03F 7/162; G03F 7/168; G03F 7/2006; H01L 21/0273; H01L 21/31116; H01L 21/31144; H01L 27/11556; H01L 27/11582; H01L 21/0332; H01L 21/31058
USPC .... 252/79.1, 79.2, 79.3, 79.4; 430/196, 311, 430/312
See application file for complete search history.

(56) References Cited

U.S. PATENT DOCUMENTS

| | | | |
|---|---|---|---|
| 9,587,065 B2 | 3/2017 | Komatsu et al. | |
| 2011/0223544 A1* | 9/2011 | Yada | G03F 7/0037 430/324 |
| 2012/0107563 A1* | 5/2012 | Yonezawa | G03F 7/40 428/156 |
| 2014/0151733 A1 | 6/2014 | Koike et al. | |
| 2018/0215842 A1* | 8/2018 | Katou | H01L 27/14627 |

FOREIGN PATENT DOCUMENTS

| | | |
|---|---|---|
| JP | 2001-310331 A | 11/2001 |
| JP | 2009-203321 A | 9/2009 |
| JP | 2012-036078 A | 2/2012 |
| JP | 2015-216180 | 12/2015 |
| JP | 6088800 B2 | 3/2017 |

OTHER PUBLICATIONS

Cianci et al., "Trimethylaluminum Diffusion in PMMA Thin Films during Sequential Infiltration Synthesis: In Situ Dynamic Spectroscopic Ellipsometric Investigation," Advanced Materials Interfaces, 5:1801016,10 pages (2018).

Gokan et al., "Dry Etch Resistance of Organic Materials," Kinetics of Changes, vol. 30, No. 1, pp. 143-146 (1983).

Biswas et al., "New Insight into the Mechanism of Sequential Infiltration Synthesis from Infrared Spectroscopy," Chemistry of Materials, vol. 26, pp. 6135-6141 (2014).

\* cited by examiner

POLYMER MATERIAL, COMPOSITION, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2019-044104 filed on Mar. 11, 2019; the entire contents of all of which are incorporated herein by reference.

FIELD

Embodiments described herein relate generally to a polymer material, a composition, and a method of manufacturing a semiconductor device.

BACKGROUND

In a manufacturing process of a semiconductor device, there is increasing demand for a technology forming a pattern with a high aspect ratio. A mask pattern used for such a process is required to have high etch resistance because it is exposed to etching gas for a long time.

DETAILED DESCRIPTION

Figure 1A:
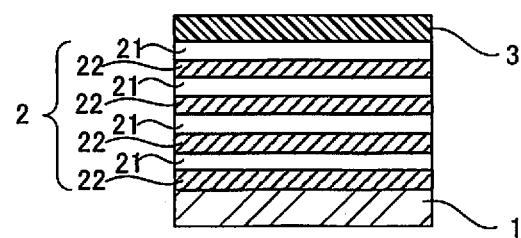
FIG. 1A is a view illustrating one process of a method of manufacturing a semiconductor device according to an embodiment.

According to one embodiment, a polymer material is disclosed. The polymer material contains a polymer. The polymer contains a first monomer unit having a lone pair and an aromatic ring at a side chain, and a second monomer unit including a crosslinking group at a terminal of the side chain, with its molar ratio of 0.5 mol % to 10 mol % to all monomer units in the polymer.

According to another embodiment, a composition contains the polymer material described above and a solvent. The composition can be used for manufacturing the composite film described above.

According to another embodiment, a method of manufacturing a semiconductor device is disclosed. The method includes forming an organic film on a target film on a semiconductor substrate with a polymer material, patterning the organic film, forming a mask pattern composed of a composite film by impregnating a metal compound into the patterned organic film and processing the target film by using the mask pattern. The polymer material contains a polymer containing a first monomer unit having a lone pair and an aromatic ring at a side chain.

Hereinafter, various embodiments will be explained in detail with reference to the drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing therein above are marked with like reference numerals, and a detailed description is omitted as appropriate.

Components in the embodiments include ones which can be easily supposed by the person skilled in the art or ones which are substantially the same.

A polymer is formed by polymerizing monomers and is formed of repeating units derived from the monomers. In the specification, the repeating unit forming the polymer is called a monomer unit (segment). The monomer unit is a unit derived from the monomer, and a component monomer of the monomer unit is a monomer forming the monomer unit by polymerization.

In consideration of the above-stated requirement, the present inventors have found that a mask pattern having high etch resistance can be obtained by forming an organic film by using a polymer material containing a specific polymer and subjecting the organic film to patterning, and then using a composite film where a metal compound is impregnated into the organic film as the mask pattern. A process of impregnating the metal compound into the organic film is called "metallization". The metallization is concretely performed by coordinating a precursor (a precursor of the metal compound which finally exists in the composite film) to a site of the organic film which has the site capable of coordinating the precursor and then oxidizing the precursor. Hereinafter, the polymer material containing the specific polymer according to the embodiment is explained.

[Polymer Material]

One embodiment of a polymer material contains a polymer containing a first monomer unit having a lone pair and an aromatic ring at a side chain. Another embodiment of the polymer material contains the polymer containing the first monomer unit which has the lone pair and the aromatic ring at the side chain and an aromatic ring at a side chain, and a second monomer unit including a crosslinking group at a terminal of the side chain, with its molar ratio of 0.5 mol % to 10 mol % to all monomer units in the polymer.

The polymer material is preferably used to form an organic film on a target film of a substrate having the target film. The polymer material is contained in, for example, a later-described composition of the embodiment together with a solvent, and applied on the target film by using the composition to form the organic film. The first monomer unit has both the lone pair and the aromatic ring at the side chain per one monomer unit.

The organic film may be formed of the polymer material in itself, or may be formed by a reaction of components contained in the polymer material. After the organic film is subjected to patterning, the metal compound is impregnated therein (the organic film is metallized) as stated above to be the composite film. The composite film is used as a mask pattern, and the target film is processed.

(Design of Polymer)

The organic film formed by using the polymer material is able to coordinate the precursor by the lone pair which is held by the first monomer unit contained in the polymer at the side chain. This phenomenon is a general phenomenon, and when an atom having the lone pair exists in the polymer, the precursor is adsorbed and stabilized, and the present inventors found that there is a positive correlation between a stabilization energy ($\Delta E$) found by a molecular orbital calculation at that time and a metallization degree obtained by experiments (K. Asakawa, et al., Microprocess and Nanotechnology Conference, 15A-4-3, 2018). Note that the metallization degree is a degree where the organic film adsorbs metal elements, and for example, it is evaluated by using a difference in film thicknesses before and after the metallization of the organic film as an index. A composite film with higher etch resistance can be obtained as the metallization degree is higher.

Concretely, the film thicknesses of the organic film before and after the metallization are measured by using an atomic force microscope (AFM), and the difference in the film thicknesses before and after the metallization is set as a metallization amount. Though there is a slight argument in a definition of the metallization amount using a change amount of the film thickness, for example, when the precursor is trimethylaluminum (TMA), it is thought that content of aluminum hydroxide or aluminum oxide obtained by oxidization of the precursor is quantified (E. Cianci, et al., Adv. Mater. Interfaces, vol. 5, 1801016, 2018).

The metallization degree of the organic film can be measured by quantifying metal atomic weight derived from the precursor by an X-ray photoelectron spectroscopy (XPS). A correlation between the metallization degree by XPS and the change by the film thickness is verified.

The first monomer unit has an aromatic ring at the side chain in addition to the lone pair. The obtained composite film thereby has a high etch resistance, in particular, a high reactive ion etching (RIE) resistance. Here, there is a case when a stacked mask structure is taken in a mask pattern to obtain a process shape having a high aspect ratio with respect to the target film. The composite film formed by using the polymer material is suitably used as a base film which is formed between a resist film and the target film when it is used for the stacked mask structure.

Conventionally, in the stacked mask structure aiming at the high etch resistance, a diamond-like-carbon (DLC) layer has been used as the base film between the resist film and the target film. The composite film formed by using the polymer material has advantages that the material is low in price and easy to form the film while having a function capable of alternating the DLC layer which is very expensive to form the film.

Here, for example, an aliphatic ring compound (alicycle acrylic resin) is normally used as a resin used for a photoresist film for argon fluoride excimer laser light (ArF light: wavelength of 193 nm) so as to secure transparency to the ArF light. However, the alicyclic acrylic resin essentially has low RIE resistance. However, when the composite film where the organic film is metallized is used as a mask pattern, light transmittance is not necessary because the composite film is used as the base film of the resist film in the stacked mask structure, but a high absorption constant is rather required for antireflection.

Accordingly, it is found that the high etch resistance, in particular, the high RIE resistance can be obtained by using a polymer where the aromatic ring in addition to the lone pair is introduced into the first monomer unit as a composing material of the organic film which is to be metallized. As a result, it is verified that the polymer has high resistance for RIE using both O-based gas and F-based gas.

As a relation between a chemical structure of the polymer and the RIE resistance, there has been known an empirical rule which is called an Ohnishi parameter represented in the following expression (1) (H. Gokan et al., J. Electrochem. Soc. vol. 130, 143, 1983).

$$R_{RIE} \propto N/(Nc-No) \tag{1}$$

In the expression (1), $R_{RIE}$ is an etching rate in the RIE, and the RIE resistance is high when a value of $R_{RIE}$ is small, and the RIE resistance is low when the value of $R_{RIE}$ is large. N is the number of all elements per a monomer unit, Nc is the number of carbon elements per the monomer unit, and No is the number of oxygen elements per the monomer unit. This empirical rule is set as a design manual, rough molecular design is carried out, and the RIE resistance is verified by using an actual polymer.

According to the expression (1), for example, the RIE resistance becomes high when the monomer unit having a lot of carbon components is contained in a molecular structure of the polymer, and the RIE resistance becomes low when the monomer unit having a lot of oxygen components is contained. In general, there is a method to introduce the aromatic ring in order to increase a ratio of the carbon component per the monomer unit. Accordingly, the RIE resistance of the polymer containing the monomer unit having the aromatic ring is expected to be high.

As a polymer contained in the polymer material, monomers containing the lone pair, preferably a carbonyl group, so as to exert a metallization property and the aromatic ring are designed, and the polymer where these monomers are polymerized is adopted.

(Stabilization Energy)

Stabilization energy ($\Delta E$) found by a molecular orbital calculation when a precursor, concretely trimethylaluminum (TMA) is adsorbed to the lone pair of the polymer, concretely, the lone pair of the carbonyl group ($>C=O:$) and stabilized is shown below.

When the polymer is exposed to the precursor, and then subjected to oxidation treatment, a metal compound can be precipitated in the polymer. For example, when polymethylmethacrylate (PMMA) being the polymer is exposed to TMA being the precursor by using a vacuum device such as an ALD device, and then subjected to treatment with $H_2O$ as an oxidant, an aluminum compound is selectively precipitated in PMMA. Note that the oxidation of the precursor may be carried out by using oxygen, ozone, plasma without being limited to the $H_2O$ treatment, or they may be combined. In a general ALD process, TMA is monolayer adsorbed to an OH group on a substrate surface, but it can be thought that a precipitation process of the aluminum compound into the polymer has a different mechanism from the above.

Biswas, et al., propose a mechanism where TMA comes close to the carbonyl group in PMMA, and then covalently bonds to the carbonyl group (M. Biswas, J. A. Libera, S. B. Darling, J. W. Elam, Chem. Mater., vol. 26, 6135, 2014). Regarding the polymer having the carbonyl group and the benzene ring in one monomer unit, it is verified through a density functional theory (DFT) by using the molecular orbit calculation program in order to confirm that TMA comes close to and bonds to the carbonyl group as same as the case of PMMA.

A calculation of a molecular structure is performed by using the molecular orbit calculation program (Gaussian09). A B3LYP method is used as a functional of the density functional theory. A 6-31G is used as a basis function set between TMA containing aluminum and the polymer, and a LanL2DZ is used as a basis function set between the precursor containing heavy metal and the polymer (https://www.hpc.co.jp/chem/software/gaussian/or https://gaussian.com/).

Regarding the precursor, optimization of the molecular structure is performed by using an energy gradient method to calculate a stabilization energy E1 of the precursor in a stable state. Regarding the polymer, a structure where three monomer units are connected is used as a model, optimization of the structure is performed by the same parameter and method as the precursor to calculate a stabilization energy E2 of the polymer in a stable state. Next, the precursor is brought close to the monomer unit at a center of the polymer to be the model from various directions, optimization of the structure is similarly performed to calculate a stabilization energy E3 under a state where the precursor is adsorbed to the polymer. Finally, the stabilization energy $\Delta E = E1 + E2 - E3$ is found. At this time, it means that the precursor is stably adsorbed to the polymer as the stabilization energy $\Delta E$ takes a larger negative value, that is, smaller.

The following chemical structural formulas are representing states where TMA is adsorbed to the carbonyl group in each of polyacetoxystyrene (PAcS), polyphenylmethacrylate (PPMA), and polybenzylmethacrylate (PBMA) each having one each of the carbonyl group and the benzene ring per one monomer unit. The stabilization energies $\Delta E$ of PAcS, PPMA, and PBMA calculated through the above-stated method are respectively −16.37 kcal/mol, −14.11 kcal/mol, and −14.63 kcal/mol. A part which is enclosed by [ ] in the chemical structural formula represents one monomer unit, and n represents a degree of polymerization. Hereinafter, [ ] and n each have the same meaning in the description of the polymer.

[Chemical structural formula 1]

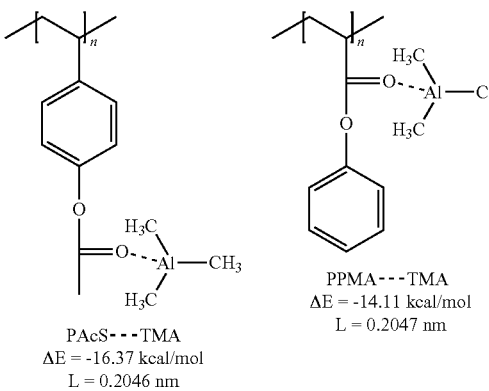

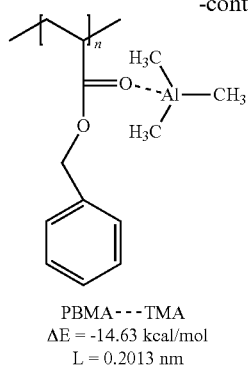

When PAcS, PPMA and PBMA are compared, the $\Delta E$ of PAcS where the carbonyl group is bonded to outside (a far side from a main chain) of the benzene ring is slightly larger, but there is no significant difference. Hereinafter, a near side to the main chain of the polymer is called inside, and the far side is called outside in the side chain. In each polymer, a distance L between an Al atom of TMA and an O atom of the carbonyl group is denoted together with the chemical structural formula. In each of PAcS, PPMA and PBMA, the distance L is approximately 0.2 nm regardless of a polymer kind. It can be thought from the above that the Al atom of TMA is drawn to the lone pair of the O atom held by the polymer and stabilized.

The $\Delta E$ of PMMA is −14.17 kcal/mol, and the distance between the Al atom of TMA and the O atom of the carbonyl group of PMMA is 0.203 nm. Accordingly, it turns out that PAcS, PPMA and PBMA each have the TMA adsorption property equivalent to or larger than PMMA.

Next, as represented by the following chemical structural formulas, the stabilization energies ($\Delta E$) when TMA is adsorbed to the carbonyl group of polybenzoylphenylacrylate (PBPA) having two each of the carbonyl groups and the benzene rings per one monomer unit are calculated. In chemical structural formula (i), TMA is adsorbed to the carbonyl group on the outside, and the $\Delta E$ is −15.44 kcal/mol. In chemical structural formula (ii), TMA is adsorbed to the carbonyl group on the inside, and the $\Delta E$ is −14.74 kcal/mol.

In chemical structural formula (iii), TMA is adsorbed to the two carbonyl groups, and the $\Delta E$ is −28.40 kcal/mol. In the chemical structural formula (iii), the $\Delta E$ when TMA is adsorbed to the two carbonyl groups is almost the same as a sum of the $\Delta E$ when TMA is adsorbed to only the carbonyl group on the outside in the chemical structural formula (i) and the $\Delta E$ when TMA is adsorbed to only the carbonyl group on the inside in the chemical structural formula (ii). It is therefore expected that two precursors are adsorbed to the two carbonyl groups held by one monomer unit without any problem in PBPA, and the polymer material containing PBPA is expected to have high metallization property being an ability to adsorb a metal element from this result.

[Chemical structural formula 2]

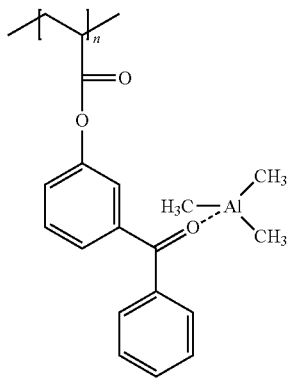

(i)

ΔE = -15.44 kcal/mol
L1 = 0.2021 nm

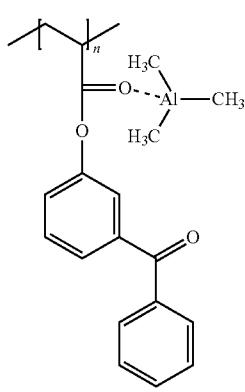

(ii)

ΔE = -14.74 kcal/mol
L2 = 0.2046 nm

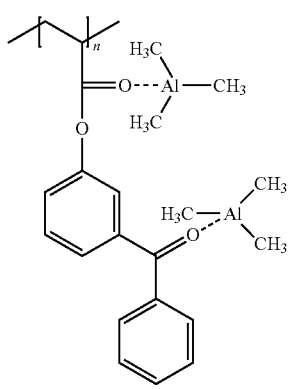

(iii)

ΔE = -28.40 kcal/mol
L1 = 0.2021 nm
L2 = 0.2058 nm

In PBPA, a distance between the Al atom of TMA and the O atom of the carbonyl group when TMA is adsorbed to the carbonyl group on the outside is set as L1, and a distance between the Al atom of TMA and the O atom of the carbonyl group when TMA is adsorbed to the carbonyl group on the inside is set as L2. The distance L1 in the chemical structural formula (i) is 0.2021 nm, and the distance L2 in the chemical structural formula (ii) is 0.2046 nm and there seems to be almost no difference. Further, the distance L1 is 0.2021 nm and the distance L2 is 0.2058 nm in the chemical structural formula (iii). That is, in PBPA, the distance between the Al atom of TMA and the O atom of the carbonyl group is approximately 0.2 nm either the carbonyl group on the inside or the outside. In PBPA, the Al atom of TMA is thought to be drawn to both of the lone pairs of the two O atoms which are held by the polymer per one monomer unit and stabilized.

It is known that TMA normally forms a dimer at the room temperature. When two molecules of TMA meet and form the dimer, the stabilization energy ΔE decreases to -11.09 kcal/mol compared to the case when TMA exists as a monomer, and it can be seen that the dimer is more stable than the TMA monomer. On the other hand, all of the stabilization energies ΔE when TMA is adsorbed to PAcS, PPMA, PBMA, and PBPA are smaller than -14 kcal/mol. Accordingly, it can be said that TMA is more stable when it is adsorbed to these polymers compared to the case when TMA exists as the dimer.

It can be thought from the above that the TMA dimers diffuse into the polymer by exposing the polymer to TMA. When the TMA dimers sufficiently come close to the carbonyl group existing at the side chain of the polymer, it becomes more advantageous to be TMA monomers and meet the carbonyl group. As a result, TMA is captured by the polymer. However, a process is repeated where TMA captured by the polymer is dissociated again to diffuse in the polymer because it is just a little stabilized in terms of energy, and therefore, TMA continues to diffuse in the polymer. Accordingly, when there is a site where the precursor stably exists such as the carbonyl group, more precursors can be held in the polymer, and the precursors are able to uniformly exist in a whole of the polymer. It is therefore possible that more TMA can be stably adsorbed to the carbonyl group at the polymer side chain if a concentration of TMA is increased to some extent.

It has been explained in the above that the carbonyl group is suitable as a structure at the polymer side chain where TMA is adsorbed based on the stabilization energy ΔE. As a result of the examination of a structure capable of adsorbing TMA based on the stabilization energy ΔE similar to the carbonyl group, polymers having a pyridine skeleton and a cyano group are able to stably adsorb TMA. It can be thought that TMA is stabilized by the lone pair held by a nitrogen atom of the pyridine skeleton or the cyano group. At this time, distances between an oxygen atom of the carbonyl group, the nitrogen atom of the pyridine skeleton or the cyano group and an aluminum atom of TMA are in a narrow range of approximately 0.20 nm to 0.22 nm. It can be thought that TMA cannot be stabilized when each interatomic distance is farther than this distance.

Meanwhile, it can be thought that the adsorption property differs depending on not only the structures of the polymer and the side chain thereof but also a kind of the precursor. For example, there are cases when the precursor has other metal atoms. The adsorption properties of $TiCl_4$, $ZrCl_4$, $HfCl_4$, $WCl_6$, $VCl_4$, $Ti(N(CH_3)_2)_4$, $Zr(N(CH_3)_2)_4$, $Hf(N(CH_3)_2)_4$, $Zr(O-CH_3)_4$, $Hf(O-CH_3)_4$, $Zr(O-C_4H_9)_4$, and $Hf(O-C_4H_9)_4$ are examined by using PMMA as the precursors each having the metal atom other than aluminum. Note that it has been verified that PAcS, PPMA and PBMA each having the carbonyl group and the benzene ring in the monomer unit have the TMA adsorption property equivalent to or more than PMMA having the carbonyl group but not having the benzene ring in the monomer unit. Accordingly, the following results are considered to be applied to the polymer having the carbonyl group and the benzene ring in the monomer unit.

When $TiCl_4$ is brought close to the carbonyl group of PMMA, $TiCl_4$ is drawn to the carbonyl group, and the stabilization energy $\Delta E$ decreased to $-14.07$ kcal/mol to be stabilized. A titanium atom of $TiCl_4$ comes close to the oxygen atom of the carbonyl group of PMMA up to 0.203 nm. At this time, a chlorine atom bonded to titanium is stabilized in an opened shape.

When $WCl_6$ is brought close to the carbonyl group of PMMA, $WCl_6$ is drawn to the carbonyl group, and the stabilization energy $\Delta E$ decreased to $-10.13$ kcal/mol to be stabilized. A tungsten atom of $WCl_6$ comes close to the oxygen atom of the carbonyl group of PMMA up to 0.212 nm.

When $VCl_4$ is brought close to the carbonyl group of PMMA, $VCl_4$ is drawn to the carbonyl group, and the stabilization energy $\Delta E$ decreased to $-14.47$ kcal/mol to be stabilized. A vanadium atom of $VCl_4$ comes close to the oxygen atom of the carbonyl group of PMMA up to 0.200 nm.

The precursors having various metals without being limited to aluminum can be used as long as a ligand of each precursor is sufficiently small as stated above.

(Embodiments of Polymer Material)

One embodiment of the polymer material contains the polymer containing the first monomer unit which has the lone pair and the aromatic ring at the side chain.

Another embodiment of the polymer material contains the polymer containing the first monomer unit which has the lone pair and the aromatic ring at the side chain and an aromatic ring at a side chain, and a second monomer unit including a crosslinking group at a terminal of the side chain, with its molar ratio of 0.5 mol % to 10 mol % to all monomer units in the polymer.

Examples of the lone pair held by the first monomer unit include the lone pairs contained in the carbonyl group ($>C\!\!=\!\!O\!:$), the cyano group ($-C\!\equiv\!N\!:$), the pyridine skeleton, an amino group ($-NH_2\!:$), and so on. The lone pair is preferably contained in the carbonyl group. The number of lone pairs held by the first monomer unit may be one or more, and preferably two or more. Though there is no particular upper limit in the number of lone pairs held by the first monomer unit, it is preferably three, and more preferably two in terms of molecular design.

Examples of the aromatic ring held by the first monomer unit include the benzene ring, a naphthalene ring, an anthracene ring, and so on. The benzene ring is preferable in terms of practicability and molecular design. The number of aromatic rings held by the first monomer unit may be one or more, and preferably two or more. Though there is no particular upper limit in the number of aromatic rings held by the first monomer unit, it is preferably three, and more preferably two in terms of the molecular design.

A structure of the main chain of the polymer contained in the polymer material is not particularly limited. An example of the structure includes the polymer where a double bond of an ethylene group ($>C\!\!=\!\!C\!<$) of a monomer having the ethylene group is cloven to form the main chain of the polymer. In this case, an example of the monomer includes the monomer where a group having the lone pair and a group having the aromatic ring are bonded to either of carbon atoms of the ethylene group. A preferable structure is a structure where a group having the lone pair and the aromatic ring is bonded to either of the carbon atoms of the ethylene group. In this case, it is preferable that a hydrogen atom or a methyl group is bonded to a remaining bond of the ethylene group.

The following group 1 and group 2 are preferable as the group having the lone pair and the aromatic ring.

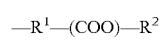  Group 1

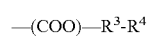  Group 2

$R^1$ is a bivalent aromatic ring, a derivative thereof, or a bivalent group obtained from benzophenone. $R^2$ is an alkyl group having 1 to 6 carbon atoms. $R^3$ is a single bond or an alkylene group having 1 to 4 carbon atoms. $R^4$ is a monovalent aromatic ring, a derivative thereof, or a benzoylphenyl group. Examples of the aromatic groups of $R^1$ and $R^4$ include benzene, naphthalene, azulene, anthracene, chrysene, pyrene, coronene, pentacene, and so on.

The group 1 is preferably a group (hereinafter, a group 1-1) where $R^1$ is a 1,4-phenylene group and $R^2$ is the methyl group in terms of practicability. There is acetoxystyrene represented by the following chemical structural formula M1-1 as a monomer where the group 1-1 is bonded to the carbon atom of the ethylene group. Hereinafter, a monomer unit based on the monomer represented by the chemical structural formula M1-1 is called a monomer unit M1-1. In the following, other monomers and monomer units are similarly denoted.

[Chemical structural formula 3]

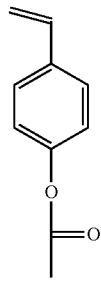

M1-1

An example of a monomer where the group 2 is bonded to the carbon atom of the ethylene group concretely includes an aromatic compound derivative of a (meth)acrylic acid. In the polymer material, the polymer containing the first monomer unit is preferably the polymer which is polymerized while using (meth)acrylate as a main monomer. Besides, a component monomer of the first monomer unit is preferably the aromatic compound derivative of the (meth)acrylic acid. That is, the first monomer unit is preferably a monomer unit formed by polymerizing the aromatic compound derivatives of the (meth)acrylic acid as the monomers.

Note that the main monomer is (meth)acrylate means a state where 90 mol % or more of a whole monomer is (meth)acrylate. The (meth)acrylic acid is a generic of an acrylic acid and a methacrylic acid. Further, (meth)acrylate is a generic of acrylate and methacrylate.

Examples of the group 2 include a group (hereinafter, a group 2-1) where $R^3$ is the single bond and $R^4$ is a phenyl group, a group (hereinafter, a group 2-2) where $R^3$ is $CH_2$ and $R^4$ is the phenyl group, and a group (hereinafter, a group 2-3) where $R^3$ is a single bond and $R^4$ is the benzoylphenyl group.

The group 2 is preferably the group 2-3 in terms of the metallization property. There are the aromatic compound derivatives of the (meth)acrylic acid represented by the following chemical structural formulas M2-1 to M2-3 as monomers where the group 2-1 to the group 2-3 are each bonded to the carbon atom of the ethylene group. In the following chemical structural formula, R is the hydrogen atom or the methyl group. Hereinafter, R in the chemical structural formula means the same thing.

[Chemical structural formula 4]

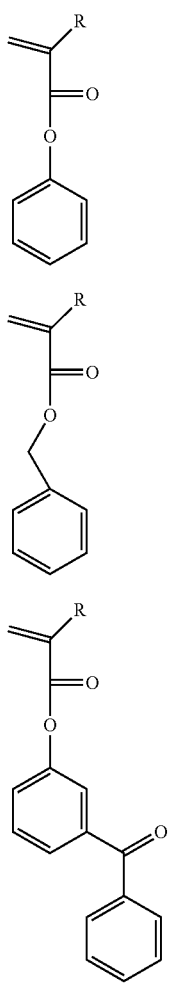

M2-1

M2-2

M2-3

The polymer contained in the polymer material (hereinafter, called a polymer X) may contain only one kind, or two or more kinds of the first monomer units. When two or more kinds of the first monomer units are contained, the polymer X may be a mixture of two or more kinds of the polymers each containing the first monomer unit, or may be one kind of the polymer containing two or more kinds of the first monomer units.

For example, when the polymer X contains a monomer unit M2-1 and a monomer unit M2-2 as the first monomer units, the polymer X may be a mixture of a polymer X1 containing the monomer unit M2-1 and a polymer X2 containing the monomer unit M2-2, or may be formed of a polymer X3 containing both the monomer unit M2-1 and the monomer unit M2-2.

A molar ratio of a sum of the first monomer units in the polymer X is preferably 30 to 100 mol %, more preferably 40 to 80 mol %, furthermore preferably 50 to 75 mol %, and particularly preferably 60 to 70 mol % with respect to all monomer units of the polymer X.

The polymer X containing the first monomer unit enables to have both the excellent metallization property in the organic film obtained from the polymer material containing the polymer X and the high etch resistance in the obtained mask pattern. The more the moral ratio of the first monomer unit in the polymer X is, the more preferable it is in terms of the metallization property and the etch resistance, but on the other hand, there are a solvent affinity in the composition, a solvent resistance of the organic film, an applying property, a patterning property, and the like as properties required for the polymer. The molar ratio of the first monomer unit is therefore determined while comprehensively considering these properties.

Manufacturing of the polymer X can be performed through a normal method, for example, bulk polymerization, solution polymerization, emulsion polymerization, suspension polymerization, and so on by using component monomers of the monomer unit. When the polymer X is synthesized by the solution polymerization, normally, predetermined monomers are dissolved in a polymerization solvent, and polymerized under presence of a polymerization initiator. The monomers used for the manufacturing of the polymer X include the component monomers of the first monomer unit. As described later, when the polymer X contains monomer units other than the first monomer unit, the component monomers of all monomer units forming the polymer X are used for polymerization. Polymerization conditions such as an amount of the polymerization solvent, a polymerization temperature, a polymerization time are appropriately selected in accordance with a kind of the monomer, molecular weight of the polymer X to be synthesized, and so on.

A weight-average molecular weight (Mw) of the polymer X is preferably 10000 to 200000 [g/mol] (hereinafter, a unit may be sometimes omitted), more preferably 20000 to 100000, and particularly preferably 40000 to 800000. The Mw of the polymer X can be measured by a gel permeation chromatography (GPC). A glass transition temperature (Tg) of the polymer X is preferably 80 to 200° C., more preferably 100 to 150° C. The Tg of the polymer X can be measured by a differential scanning calorimeter (DSC).

Table 1 lists properties of homopolymers whose monomers are each of styrene, 4-acetoxystyrene, phenylmethacrylate, phenylacrylate, benzylacrylate and benzoylphenylacrylate. The Tg of the polymer is the Tg in the polymer where the molecular weight is infinite.

TABLE 1

| Monomer | Styrene | 4-acetoxy styrene | Phenyl acrylate | Phenyl methacrylate | Benzyl acrylate | Benzyl methacrylate | Benzoyl phenyl acrylate | Benzoyl phenyl methacrylate |
|---|---|---|---|---|---|---|---|---|
| Polymer structural formula | | | | | | | | |
| Solubility parameter [(J/cc)$^{0.5}$] | 19.52 | 19.16 | 19.71 | 19.04 | 19.59 | 18.99 | 20.81 | 20.33 |
| Molar volume [cc/mole] | 96.98 | 137.33 | 119.57 | 136.66 | 134.31 | 151.39 | 202.82 | 219.91 |
| Molecular weight | 106.17 | 162.19 | 148.16 | 162.29 | 162.19 | 176.72 | 252.27 | 270.33 |
| Polymer Tg [° C.] | 108.52 | 101.24 | 108.16 | 129.59 | 90.45 | 111.68 | 134.98 | 146.39 |

The polymer X may contain monomer units other than the first monomer unit within a range not impairing effects of the embodiment so as to supply required properties in addition to the metallization property and the etch resistance as a material forming the mask pattern.

For example, when the monomer unit M2-3 is selected as the first monomer unit, and a molar ratio of the monomer unit M2-3 in the polymer X is set to 100 mol %, the very high metallization property is exerted, but a shape retention in a fine pattern becomes sometimes difficult when a film thickness increase rate due to metallization is too high.

Accordingly, the polymer X may contain the monomer units other than the first monomer unit within the range not impairing the effect of the present embodiment as stated above. For example, it can be thought that the monomer unit M2-3 exerts the sufficiently high metallization property even when the molar ratio in the polymer X is set to 50 mol %. It can be thought that monomer units having other functions are introduced into the polymer X at a molar ratio excluding the molar ratio occupied by the first monomer unit, for example, at the molar ratio of 50 mol %. The high-performance polymer X can be thereby obtained.

An example of other functions required for the polymer X includes a function to make the obtained organic film hardly soluble with respect to an organic solvent. This property is particularly required when the polymer material is applied to a stacked mask structure. In the stacked mask structure, the organic film formed by using the polymer material is preferably formed between the resist film and the target film as the base film. In this case, normally, another layer forming the stacked mask is formed by a method dissolving a material forming the layer into the organic solvent or the like and applying on the organic film, what is called a wet-coating method. At this time, when the organic film formed by using the polymer X is soluble to the organic solvent used in the wet-coating method, it is not preferable because a part of the organic film is dissolved to form a mixed layer where the dissolved organic film is mixed with a composing material the layer formed on the organic film.

For example, when the polymer X whose molar ratio of the first monomer unit is 100 mol % is used, the polymer X exists in the organic film as it is. In this case, the polymer X is eluted into the organic solvent. The present inventors therefore arrived at an idea that a second monomer unit having a crosslinking group at a terminal of the side chain is introduced into the polymer X in addition to the first monomer unit, to thereby suppress elution of film components in the obtained organic film. It is thereby possible to obtain hardly-soluble organic film formed by using the polymer X with respect to the organic solvent, and the mixed layer is seldom formed even when an upper layer of the organic film is formed by the wet-coating method. Hereinafter, the polymer X having the second monomer unit in addition to the first monomer unit is sometimes called a crosslinkable polymer X.

Though the crosslinking group held by the second monomer unit is not particularly limited as long as it is a functional group having crosslinkability, a functional group exerting the crosslinkable function by external energy, for example, by heating or light irradiation is preferable in terms of storage stability. Examples of the crosslinking group include a glycidyl group, an oxetanyl group, the amino group, an azide group, a thiol group, a hydroxyl group, a carboxyl group, and so on, and the glycidyl group is particularly preferable in terms of an operating temperature of a crosslinking reaction and the storage stability.

An example of the component monomer of the second monomer unit includes a monomer where a monovalent organic group having the crosslinking group at the terminal is bonded to either of the carbon atoms of the ethylene group. As the component monomer of the second monomer unit, (meth)acrylate where a compound having the crosslinking group at a terminal is ester-bonded to the (meth) acrylic acid is preferable.

An example of (meth)acrylate having the glycidyl group among (meth)acrylates to be the component monomers of the second monomer unit concretely includes a compound represented by the following chemical formula L1.

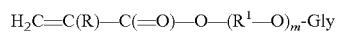   L1

In the chemical formula L1, R is the hydrogen atom or the methyl group, Gly is the glycidyl group, m is 0 to 2, and $R^{11}$ is the alkylene group having 1 to 6 carbon atoms. Examples of (meth)acrylate represented by the chemical formula L1 to be the component monomer of the second monomer unit concretely include glycidyl(meth)acrylate represented by the following chemical structural formula L1-1, and 4-hydroxybutyl(meth)acrylateglycidylether represented by the following chemical structural formula L1-2.

[Chemical structural formula 5]

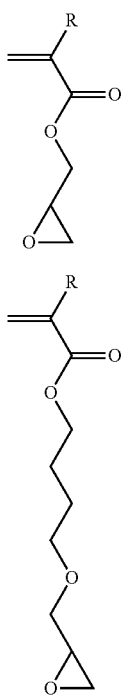

L1-1

L1-2

An example of (meth)acrylate having the oxetanyl group among (meth)acrylates to be the component monomers of the second monomer unit concretely includes (3-ethyl-3-oxetanyl)methyl(meth)acrylate represented by the following chemical structural formula L2-1.

[Chemical structural formula 6]

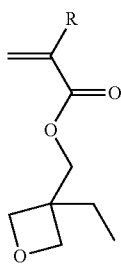

L2-1

When the polymer X contained in the polymer material contains the second monomer unit, the polymer X may contain only one kind or may contain two or more kinds of the second monomer units. When the polymer X contains one kind of the first monomer unit and two or more kinds of the second monomer units, the polymer X may be a mixture of two or more kinds of the polymers each containing the first monomer unit and each of the second monomer units, or may be one kind of the polymer containing one kind of the first monomer unit and two or more kinds of the second monomer units.

When the polymer X contains two or more kinds of the first monomer units and one kind of the second monomer unit, the polymer X may be a mixture of two or more kinds of the polymers each containing the second monomer unit and each of the first monomer units, or may be one kind of the polymer containing two or more kinds of the first monomer units and one kind of the second monomer unit.

When the polymer X contains the first monomer unit and the second monomer unit, the crosslinking groups of the second monomer units contained in different polymer chains react with each other to bond, and thereby, respective main chains of a plurality of polymers are crosslinked to be hardly soluble regardless that the polymer is formed of a mixture of two or more kinds of the polymers or one kind of the polymer as stated above. The reaction between the crosslinking groups is preferably carried out by, for example, heating, light irradiation, and the like at a formation time of the organic film.

A molar ratio of the second monomer unit in the polymer X is preferably 0.5 mol % or more and 10 mol % or less, more preferably 1 mol % or more and 7 mol % or less, and further preferably 2 mol % or more and 5 mol % or less with respect to all monomer units forming the polymer X.

When the molar ratio of the second monomer unit is less than 0.5 mol % of all monomer units, crosslinking in the polymer X is not sufficiently carried out and the hardly soluble polymer cannot be sufficiently obtained, resulting in that there is a possibility that components of the organic film are eluted into a wet-coating solution used to form the upper layer of the organic film. When the molar ratio of the second monomer unit is over 10 mol % of all monomer units, a crosslink density becomes too high, diffusion of the precursor into the organic film is suppressed, resulting in that metallization up to a deep part of the organic film is not performed.

When the polymer X contains the second monomer unit, the polymer X preferably contains each one kind of the first monomer unit and the second monomer unit. An example of a preferable combination of the first monomer unit and the second monomer unit includes the monomer unit M2-3 as the first monomer unit and the monomer unit L1-1 as the second monomer unit.

Hereinafter, the crosslinkable polymer X is explained while using the case when the first monomer unit is the monomer unit M2-3 and the second monomer unit is the monomer unit L1-1 as an example. The following explanation is applied to the crosslinkable polymer X whose first monomer unit is the first monomer unit other than the monomer unit M2-3 and whose second monomer unit is the second monomer unit other than the monomer unit L1-1.

The following chemical structural formula X11 represents a chemical structural formula of the polymer X formed by combining the monomer unit M2-3 and the monomer unit L1-1. The polymer represented by the chemical structural formula X11 is hereinafter called a polymer X11. Other polymers are similarly denoted in the following.

[Chemical structural formula 7]

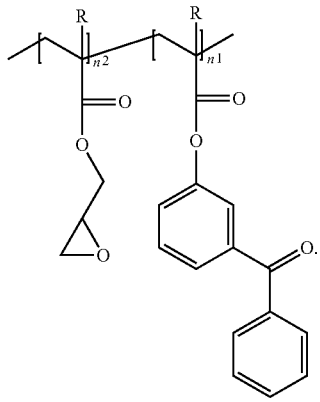

X11

The polymer X11 is formed of the monomer unit M2-3 and the monomer unit L1-1. Where n2 represents a mol % of the monomer unit L1-1 with respect to all monomer units in the polymer X11, and n1 represents a mol % of the monomer unit M2-3 with respect to all monomer units in the polymer X11. In the polymer X11, a sum of n1 and n2 is 100 mol %. In the polymer X11, the monomer unit M2-3 and the monomer unit L1-1 may exist alternately, or randomly. Each monomer unit preferably exists uniformly in accordance with a molar ratio of each monomer unit.

When the polymer X contained in the polymer material is the crosslinkable polymer X and formed of only the polymer X11, n2 in the polymer X11 is preferably 0.5 mol % or more and 10 mol % or less, more preferably 1 mol % or more and 7 mol % or less, and further preferably 2 mol % or more and 5 mol % or less as same as the above explanation. Where n1 is preferably 90 mol % or more and 99.5 mol % or less, more preferably 93 mol % or more and 99 mol % or less, and further preferably 95 mol % or more and 98 mol % or less.

The crosslinkable polymer X may be a mixture of the polymer X11 and another crosslinkable polymer X. For example, the crosslinkable polymer X may be a mixture of the polymer X11 and the polymer X (hereinafter, a polymer X12) containing a monomer unit M2-1 as another first monomer unit instead of the monomer unit M2-3 being the first monomer unit in the polymer X11. Further, for example, the crosslinkable polymer X may be a mixture of the polymer X11 and the polymer X (hereinafter, a polymer X13) containing a monomer unit M2-2 as another first monomer unit instead of the monomer unit M2-3 being the first monomer unit in the polymer X11. Furthermore, for example, the crosslinkable polymer X may be a mixture of the polymer X11 and the polymer X (hereinafter, a polymer X14) containing a monomer unit L1-2 as another second monomer unit instead of the monomer unit L1-1 being the second monomer unit in the polymer X11.

When the crosslinkable polymer X is the mixture of the polymer X11 and another crosslinkable polymer X, molar ratios of the first monomer unit and the second monomer unit in each crosslinkable polymer are not necessarily in the above-stated range. The molar ratios of the first monomer unit and the second monomer unit are preferably in the above-stated ranges as a whole of the mixture.

For example, when the crosslinkable polymer X is the mixture of the polymer X11 and the polymer X12, a sum of the monomer unit M2-3 and the monomer unit M2-1 is preferably 90 mol % or more and 99.5 mol % or less, more preferably 93 mol % or more and 99 mol % or less, and further preferably 95 mol % or more and 98 mol % or less with respect to all monomer units where the polymer X11 and the polymer X12 are summed up. Further, a sum of the monomer units L1-1 in the polymer X11 and the polymer X12 is preferably 0.5 mol % or more and 10 mol % or less, more preferably 1 mol % or more and 7 mol % or less, and further preferably 2 mol % or more and 5 mol % or less with respect to all monomer units where the polymer X11 and the polymer X12 are summed up.

The molar ratio of each monomer unit in the crosslinkable polymer X is adjustable by adjusting the molar ratios of the monomers used at the polymerization time. The Mw and the Tg of the crosslinkable polymer X can be set as same as the Mw and the Tg in the above-stated polymer X including the preferable ranges thereof. The polymerization of the crosslinkable polymer X is similar to the case of the polymer X explained above, and the Mw and the Tg can be adjusted by appropriately selecting the polymerization conditions.

A structure of the polymer X after crosslinking when the polymer X11 is used as the crosslinkable polymer X is represented by a chemical structural formula L-X11. As represented by the chemical structural formula L-X11, the polymer X11 is crosslinked by a —$CH_2$—$CH(OH)$—$CH_2$— bond which is formed by ring-opening an epoxy ring of the glycidyl group held by the monomer unit L1-1 and bonded to the carbonyl group. In the chemical structural formula L-X11, na, nb each represent a degree of polymerization of the monomer unit surrounded by [ ].

[Chemical structural formula 8]

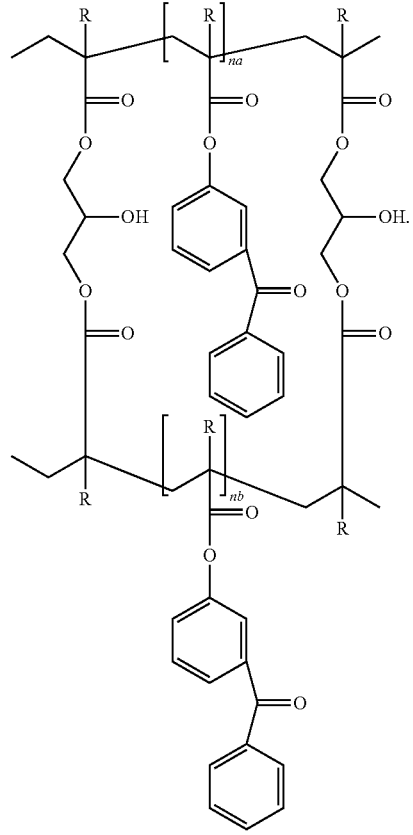

L-X11

A condition when the crosslinkable polymer X is crosslinked depends on a kind of the crosslinking group held by the second monomer unit. For example, when the crosslinking group is the glycidyl group or the oxetanyl group, the crosslinking is performed by ring-opening the epoxy ring or an oxetane ring. Accordingly, the polymer X is crosslinked by subjecting to heating or light irradiation under a condition where the epoxy ring and the oxetane ring are ring-opened. Note that a curing agent may be used when the crosslinkable polymer X is crosslinked.

The curing agent has reactivity with respect to the crosslinking group, and the crosslinking groups can be bonded through the curing agent. The crosslinking reaction is accelerated by the curing agent, and the polymers X are likely to be crosslinked. Accordingly, a suitable curing agent is different depending on the kind of the second monomer unit. For example, when the crosslinking group held by the second monomer unit is the glycidyl group, an amine compound, a compound having an acid anhydride skeleton, a compound having a carboxylic acid, a compound having the hydroxyl group can be suitably used as the curing agent.

The amine compound has a plurality of primary amines or secondary amines in a skeleton. Examples of the amine compound which can be used as the curing agent include, for example, ethylenediamine, trimethylenediamine, tetramethylenediamine, pentamethylenediamine, hexamethylenediamine, heptamethylenediamine, octamethylenediamine, nonamethylenediamine, decamethylenediamine, diethylenetriamine, triethylenetetramine, tetraethylenepentamine, pentaethylenehexamine, 1,2-diaminocyclohexane, 1,3-diaminocyclohexane, 1,4-diaminocyclohexane, o-phenylenediamine, m-phenylenediamine, p-phenylenediamine, m-xylenediamine, p-xylenediamine, isophoronediamine, 4,4'-methylenedianiline, diaminodiphenylsulfone, diaminodiphenylether, and so on.

Examples of the compound having the acid anhydride skeleton which can be used as the curing agent include, for example, a hexahydrophthalic acid anhydride, a 4-methylhexahydrophthalic acid anhydride, a succinic acid anhydride, an itaconic acid anhydride, a dodecenylsuccinic acid anhydride, and so on.

Examples of the compound having the carboxylic acid which can be used as the curing agent include, for example, a hexahydrophthalic acid, a 4-methylhexahydrophthalic acid, the succinic acid, the itaconic acid, a dodecenylsuccinic acid, a citric acid, a terephthalic acid, and so on.

The compound having the hydroxyl group contains a plurality of hydroxyl groups in a skeleton. Examples of the compound having the hydroxyl group which can be used as the curing agent include, for example, polyphenol, 1,4-benzenediol, 1,3-benzenediol, 1,2-benzenediol, ethyleneglycol, and so on.

A curing accelerator having tertiary amine may be added so as to increase reactivity of the above-stated curing agents other than the amine compound. Examples of the curing accelerator include, for example, cyandiamide, 1,8-diazabicyclo(5,4,0)-undecen-7, 1,5-diazabicyclo(4,3,0)-nonene-5, tris(dimethylaminomethyl)phenol, ethyleneglycol, and so on.

A curing group in the above-described curing agent may be introduced into the side chain of the crosslinkable polymer X so as to accelerate the crosslinking reaction. Concretely, a monomer unit having a curing functional group having reactivity with the crosslinking group held by the second monomer unit may be contained at the terminal of the side chain in addition to the first monomer unit and the second monomer unit.

The curing functional group is appropriately selected in accordance with the crosslinking group held by the second monomer unit. When the crosslinking group is the glycidyl group, examples of the curing functional group include the amino group, the acid anhydride skeleton, the carboxyl group, the hydroxyl group, and so on. The curing functional group is preferably introduced into the crosslinkable polymer X as a functional group exerting the curability through external energy, for example, heating or light irradiation in terms of the storage stability of the crosslinkable polymer X.

For example, when the crosslinking group held by the second monomer unit of the crosslinkable polymer X is the glycidyl group, the crosslinkable polymer X preferably contains a third monomer unit including a group which is able to form the carboxyl group due to the heating or the light irradiation at the terminal of the side chain. In this case, a molar ratio of the third monomer unit with respect to all monomer units in the crosslinkable polymer X is preferably 0.2 to 50 mol %, more preferably 0.5 to 20 mol %, and further preferably 1 to 5 mol %.

When the molar ratio of the third monomer unit is less than 0.2 mol % of all monomer units, there is a possibility that an effect of the curing acceleration due to the third monomer unit in the polymer X cannot be sufficiently obtained. When the molar ratio of the third monomer unit is over 50 mol % of all monomer units, the ratio of the first monomer unit becomes small, and improvement in the etch resistance and the metallization property being the main objects of the present application cannot be obtained.

An example of the group formable the carboxyl group by the heating or the light irradiation concretely includes —C(=O)—O—$R^{12}$ (where $R^{12}$ is a chain or cyclic saturated hydrocarbon group where the carbon atom bonded to oxygen is tertiary carbon, and an oxygen atom may be held between the carbon atoms). Examples of $R^{12}$ concretely include a t-butyl group, —C(CH$_3$)$_2$CH$_2$CH$_3$, a t-butyl adamantane group, a methylcyclohexyl group, a methyladamantyl group, a pyranyl group, and so on. The t-butyl group and the pyranyl group are preferable as $R^{12}$ in terms of a decomposition temperature. As a component monomer of the third monomer unit, an ester of the (meth)acrylic acid is preferable, and t-butyl(meth)acrylate where $R^{12}$ in the above is the t-butyl group is particularly preferable.

When the crosslinkable polymer X has the third monomer unit, the third monomer unit may be one kind or two or more kinds. When the third monomer unit is introduced into the polymer X, the third monomer unit is introduced into a polymer chain containing, for example, the first monomer unit and the second monomer unit having the glycidyl group. A polymer represented by a chemical structural formula X31 is exemplified as such a polymer X. A polymer X31 is a copolymer where the first monomer unit is the monomer unit M2-3, the second monomer unit is the monomer unit L1-1, and the component monomer of the third monomer unit is t-butyl(meth)acrylate.

[Chemical structural formula 9]

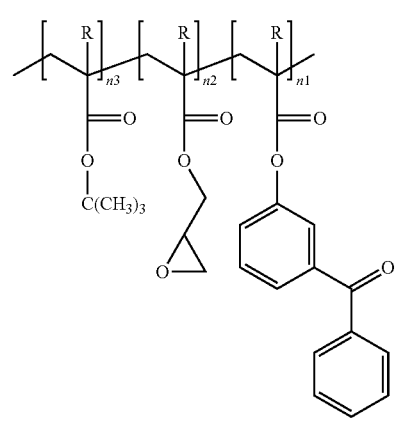

X31

The polymer X31 is formed of the monomer unit M2-3, the monomer unit L1-1, and a monomer unit derived from t-butyl(meth)acrylate (hereinafter, a monomer unit t-B(M)A). Where n1 represents a mol % of the monomer unit M2-3 with respect to all monomer units in the polymer X31, n2 represents a mol % of the monomer unit L1-1 with respect to all monomer units in the polymer X31, and n3 represents a mol % of the monomer unit t-B(M)A with respect to all monomer units in the polymer X31.

In the polymer X31, a sum of n1, n2, and n3 is 100 mol %. In the polymer X31, the monomer unit M2-3, the monomer unit L1-1, and the monomer unit t-B(M)A may exist alternately or randomly. Each monomer unit preferably exists uniformly in accordance with a molar ratio of each monomer unit.

When the polymer X contained in the polymer material is the crosslinkable polymer X, and formed of only the polymer X31, the ratio of n3 in the polymer X31 is preferably 0.2 to 50 mol %, more preferably 0.5 to 30 mol %, and further preferably 1 to 5 mol % as same as the above explanation. The ratio of n2 is preferably 0.5 to 10 mol %, more preferably 1 to 7 mol %, and further preferably 2 to 5 mol %. The ratio of n1 is preferably 49.5 mol % or more and 99.3 mol % or less, more preferably 90 mol % or more and 99 mol % or less, and further preferably 95 mol % or more and 98 mol % or less.

The crosslinkable polymer X may be a mixture of the polymer X31 and another crosslinkable polymer X. For example, the crosslinkable polymer X may be a mixture of the polymer X31 and the polymer X (hereinafter, a polymer X32) containing a monomer unit M2-1 as another first monomer unit instead of the monomer unit M2-3 being the first monomer unit in the polymer X31. Further, for example, the crosslinkable polymer X may be a mixture of the polymer X31 and the polymer X (hereinafter, a polymer X33) containing a monomer unit M2-2 as another first monomer unit instead of the monomer unit M2-3 being the first monomer unit in the polymer X31. Furthermore, for example, the crosslinkable polymer X may be a mixture of the polymer X31 and the polymer X (hereinafter, a polymer X34) containing a monomer unit L1-2 as another second monomer unit instead of the monomer unit L1-1 being the second monomer unit in the polymer X31.

When the crosslinkable polymer X is the mixture of the polymer X31 and another crosslinkable polymer X, the molar ratios of the first monomer unit, the second monomer unit, and the third monomer unit in each crosslinkable polymer are not necessarily in the above-stated ranges. The molar ratios of the first monomer unit, the second monomer unit and the third monomer unit are preferably in the above-stated ranges as the whole mixture.

For example, when the crosslinkable polymer X is the mixture of the polymer X31 and the polymer X32, a sum of the molar ratio of the monomer unit M2-3 and the monomer unit M2-1 with respect to all monomer units where the polymer X31 and the polymer X32 are summed up is preferably the same range as n1 which is the molar ratio of the first monomer unit in the polymer X31 indicated by above chemical structural formula X31.

A sum of the molar ratio of the monomer units L1-1 in the polymer X31 and the polymer X32 with respect to all monomer units where the polymer X31 and the polymer X32 are summed up is preferably the same range as n2 which is the molar ratio of the second monomer unit in the polymer X31 indicated by above chemical structural formula X31.

A sum of the molar ratio of the monomer units t-B(M)A in the polymer X31 and the polymer X32 with respect to all monomer units where the polymer X31 and the polymer X32 are summed up is preferably the same range as n3 which is the molar ratio of the third monomer unit in the polymer X31 indicated by above chemical structural formula X31.

Also in this case, the molar ratio of each monomer unit in the crosslinkable polymer X is adjustable by adjusting the molar ratios of the monomers used at the polymerization time. The Mw of the crosslinkable polymer X is preferably 5000 to 200000, more preferably 20000 to 100000, and particularly preferably 40000 to 80000. The Tg of the crosslinkable polymer X is preferably 70 to 200° C., more preferably 90 to 150° C., and particularly preferably 100 to 130° C. The Mw and the Tg can be adjusted by appropriately selecting the polymerization conditions.

When the third monomer unit is introduced into the polymer X, the third monomer unit is not necessarily introduced into the polymer chain containing the first monomer unit and the second monomer unit like the polymer X31. For example, a copolymer containing the first monomer unit and the third monomer unit is fabricated, and the crosslinkable polymer X containing the third monomer unit may be formed as a mixture of the copolymer containing the first monomer unit and the third monomer unit and a copolymer containing the first monomer unit and the second monomer unit.

For example, a polymer X21 represented by the following chemical structural formula X21 is a copolymer formed of the monomer unit M2-3 as the first monomer unit and the monomer unit t-B(M)A as the third monomer unit. The crosslinkable polymer X can be formed by combining the polymer X21 and the polymer X11.

[Chemical structural formula 10]

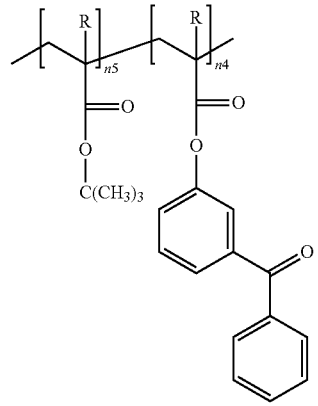

X21

In the polymer X21, n4 represents a mol % of the monomer unit M2-3 with respect to all monomer units in the polymer X21, and n5 represents a mol % of the monomer unit t-B(M)A. In the polymer X21, a sum of n4 and n5 is 100 mol %. In the polymer X21, the monomer unit M2-3 and the monomer unit t-B(M)A may exist alternately, or randomly. Each monomer unit preferably exists uniformly in accordance with a molar ratio of each monomer unit.

Also in the polymer containing the first monomer unit and the third monomer unit exemplified by the polymer X21, the ratio of each monomer unit is adjustable by adjusting the molar ratios of the monomers used at the polymerization time. The Mw of the polymer, in this case, is preferably 5000 to 200000, more preferably 20000 to 100000, and particularly preferably 40000 to 80000. The Tg of the polymer is preferably 70 to 200° C., more preferably 90 to 150° C., and particularly preferably 100 to 130° C. The Mw and the Tg can be adjusted by appropriately selecting the polymerization conditions.

When the crosslinkable polymer X is formed by combining the polymer X21 and the polymer X11, the molar ratios of the first monomer unit, the second monomer unit and the third monomer unit in the whole crosslinkable polymer X can be adjusted by adjusting the molar ratios of n1 and n2 in the polymer X11, n4 and n5 in the polymer X21, and the polymer X21 and the polymer X11 in the crosslinkable polymer X.

For example, in the polymer X where the polymer X21 and the polymer X11 are mixed at a molar ratio of 1:1, the molar ratio (mol %) of the first monomer unit is (n1+n4)/2, the molar ratio (mol %) of the second monomer unit is n2/2, and the molar ratio (mol %) of the third monomer unit is n5/2.

The polymer X contained in the polymer material may further contain another monomer unit (hereinafter, it is called a "different monomer unit") other than the first monomer unit, the second monomer unit, and the third monomer unit according to need. Solubility to a solvent in the composition, film formability at an applying time, a glass transition point of an obtained organic film, a solvent resistance of the organic film, and so on of the polymer X can be adjusted by the different monomer unit held by the polymer X.

Examples of the monomer forming the different monomer unit include, for example, styrene, hydroxystyrene, vinylnaphthalene, vinylanthracene, methyl(meth)acrylate, ethyl(meth)acrylate, hydroxylethyl(meth)acrylate, and so on.

The different monomer unit can be formed of at least any one of these monomers. A molar ratio of the different monomer unit is preferably less than 50 mol %, and further preferably less than 30 mol % with respect to all monomer units forming the polymer X. The molar ratio of the different monomer unit is set to be less than 50 mol %, resulting in that a density of the lone pair and the aromatic ring in the organic film can be kept high, and more precursors can be adsorbed into the organic film having enough aromatic rings.

The polymer material may contain components other than the polymer X within a range not impairing the effect of the present embodiment according to need in addition to the polymer X. Examples of the components other than the polymer X typically include the above-stated curing agent, and curing accelerator. Examples of the components other than the curing agent and the curing accelerator include a photoacid generator, a thermal acid generator, a photo-base generator, a thermal-base generator, a photo-radical generator, a thermal-radical generator, and so on. Content of the component other than the polymer X in the polymer material can be appropriately selected according to each component. For example, the curing agent is preferably contained at a ratio of 0.5 to 2 mol, and more preferably at a ratio of 0.8 to 1.4 mol with respect to 1 mol of the crosslinking group held by the polymer X. Contents of the components other than the polymer X other than the curing agent are preferably 20 mass % or less, more preferably 10 mass % or less, further preferably 2 mass % or less, and particularly preferably not contained with respect to a whole amount of the polymer material.

A method to form the organic film by using the polymer material may be a dry-coating method or the wet-coating method. When the organic film is formed by the dry-coating method, the organic film can be formed through the dry-coating method, for example, a vapor deposition method by using the polymer material itself. When the organic film is formed through the wet-coating method, a method forming the organic film is preferable where a composition containing the polymer material and a solvent is applied on the target film, and dried.

(Embodiment of Composition)

A composition of the embodiment contains the polymer material described above and a solvent. One example of the polymer material contains a polymer containing a first monomer unit having a lone pair and an aromatic ring at a side chain. Another example of the polymer material contains the polymer containing the first monomer unit which has the lone pair and the aromatic ring at the side chain and an aromatic ring at a side chain, and a second monomer unit including a crosslinking group at a terminal of the side chain, with its molar ratio of 0.5 mol % to 10 mol % to all monomer units in the polymer.

The composition can be used for manufacturing a composite film as a mask pattern for processing a target film on a substrate. The composite film can be formed by a process including, forming an organic film on the target film using the composition, patterning the organic film, and forming the composite film by impregnating a metal compound into the patterned organic film.

The polymer material described above can be used as the polymer material in the composition of the embodiment. The composition of the embodiment can be used for similar uses as described above in the polymer material. The solvent in the composition of the embodiment is not particularly limited as long as it is the solvent which dissolves the polymer X contained in the polymer material.

Examples of the solvent dissolving the polymer X include aromatic hydrocarbons such as toluene, xylene, mesitylene; ketones such as cyclohexanone, acetone, ethylmethylketone, methylisobutylketone; cellosolves such as methylcellosolve, methylcellosolveacetate, ethylcellosolveacetate, butylcellosolveacetate, propylene glycol monomethyl ether acetate (PGMEA), and cellosolves are preferable. A boiling point of the solvent is preferably 120° C. or more and 180° C. or less in consideration of film-formability at an applying time. Two or more kinds of the solvents can be combined to be used according to need.

Content of the polymer material in the composition of the embodiment is adjusted together with an applying condition at the applying time, such as a rotation number in a spin coating, according to required film thickness. It is thereby possible to finely form the organic film on the target film by the wet-coating method.

A normal method can be applied as a coating method for the composition of the embodiment on the target film by the wet-coating method. Concretely, a spin coating and a dip coating are preferable. After that, the solvent is removed from an applied film of the composition by drying, and thereby, the organic film can be formed. When the polymer X is the crosslinkable polymer X, crosslinking process according to the crosslinkable polymer X used at the organic film forming time, for example, heating or light irradiation is performed to enable crosslinking.

(Embodiment of Method of Manufacturing Semiconductor Device)

A method of manufacturing a semiconductor device of an embodiment includes the following processes (1) to (4).

(1) A process of forming an organic film on a target film of a semiconductor substrate having the target film by using a polymer material
(2) A process of patterning the organic film obtained through (1)
(3) A process of forming a mask pattern composed of a composite film by impregnating a metal compound into the patterned organic film
(4) A process of processing the target film by using the mask pattern In the method of manufacturing the semiconductor device of the embodiment, the polymer material used in the process (1) contains a polymer containing a first monomer unit having a lone pair and an aromatic ring at a side chain.

The polymer material described above can be applied as the polymer material used in the method of manufacturing the semiconductor device of the embodiment.

Hereinafter, the method of manufacturing the semiconductor device of the embodiment is explained by using FIG. 1A to FIG. 1E. FIG. 1A to FIG. 1E are sectional views each illustrating one process of the method of manufacturing the semiconductor device according to the embodiment. In the method of manufacturing the semiconductor device of the embodiment, the processes proceed in a sequence of FIG. 1A to FIG. 1E.

FIG. 1A is the sectional view schematically illustrating the process of (1), that is, the process of forming the organic film on the target film of the semiconductor substrate having the target film by using the polymer material. In the present embodiment, an organic film 3 is formed from the polymer material so as to process a target film 2 formed on a semiconductor substrate 1.

In the process of (1), first, the semiconductor substrate 1 where the target film 2 is formed is prepared. The target film 2 may be a single layer film such as a silicon oxide film or may be a stacked film or the like forming a three-dimensional memory cell array such as a NAND-type flash memory. In an example illustrated in FIG. 1A, the target film 2 is the stacked film where nitride films 21 and oxide films 22 are alternately stacked.

The polymer material is applied on the target film 2 of the semiconductor device 1. In a case of the dry-coating method such as the vapor deposition, for example, the polymer material itself is applied. In a case of the wet-coating method such as the spin coating or the dip coating, the composition of the embodiment is applied. Next, drying to remove the solvent and heating or light irradiation for crosslinking are performed according to need, and the organic film 3 is formed on the target film 2.

The drying is performed in the case of the wet-coating method. The crosslinking is performed when the polymer X contained in the polymer material is the crosslinkable polymer X. The crosslinking is enabled by bonding the crosslinking groups between different polymers. When the curing agent or the like is added, the bonding of the crosslinking groups is performed through molecules of the curing agent. When the crosslinking group is the glycidyl group and the polymer X contains the third monomer unit having the group formable the carboxyl group by heating or light irradiation, the crosslinking is performed through a reaction between the glycidyl group and the carboxyl group by the heating or the light irradiation.

When the crosslinking is performed by heating, a heating temperature depends on the crosslinking group and a kind of the group which is able to form the carboxyl group due to the heating. The heating temperature is preferably about 120° C. or more, more preferably 160° C. or more, and further preferably 200° C. or more. Note that the heating temperature is preferably less than 300° C. so as to suppress decomposition of a polymer main chain. In the case of the wet-coating method, drying, that is, removal of the solvent contained in the composition of the embodiment is normally concurrently carried out through this heating. The organic film 3 formed of the polymer material, or where the polymers X in the polymer material are crosslinked is thereby obtained.

Figure 1B:
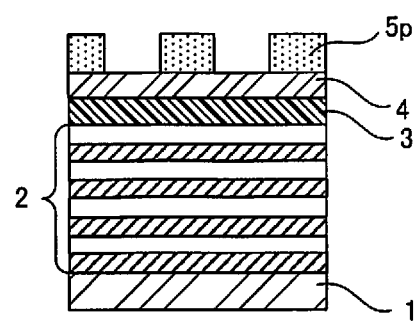
FIG. 1B is a view illustrating one process of the method of manufacturing the semiconductor device according to the embodiment.
Figure 1C:
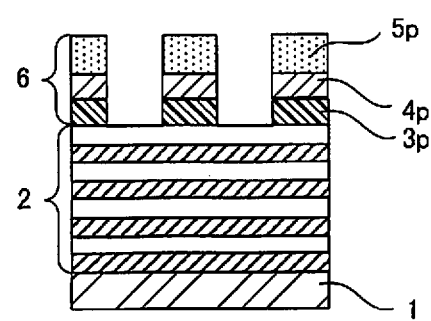
FIG. 1C is a view illustrating one process of the method of manufacturing the semiconductor device according to the embodiment.

FIG. 1B and FIG. 1C are sectional views each schematically illustrating the process of (2), that is, the process of patterning the organic film 3 obtained through (1). As illustrated in FIG. 1B and FIG. 1C, the organic film 3 functions as a base layer of a stacked mask structure 6. FIG. 1B illustrates a state where a silicon oxide film 4 is formed on the organic film 3 as a functional film performing the patterning, and a resist pattern 5p is formed thereon.

The silicon oxide film 4 is formed by, for example, heating an SOG (spin on glass) film formed on the organic film 3 through the following method at a predetermined temperature of, for example, 150 to 350° C. The SOG film is generally formed by spin-coating a wet-coating solution where a siloxane component is dissolved in an organic solvent on the organic film 3.

At this time, a non-illustrated antireflection film may be formed on the silicon oxide film 4. The antireflection film prevents reflection from a base when a resist film formed through the following process is patterned and enables precision exposure.

Next, the resist film is formed on the silicon oxide film 4, and the resist film is made to be the resist pattern 5p by using a lithography technology or an imprinting technology. In the imprinting technology, resist is dropped on the silicon oxide film 4, a template where a fine pattern is formed is pressed onto the resist film, the resist film is cured by irradiating ultraviolet ray, and thereby, the resist pattern 5p is formed.

FIG. 1C is a sectional view illustrating a state after the silicon oxide film 4 is etching-processed while using the resist pattern 5p as a mask to form a silicon oxide film pattern 4p, and further the organic film 3 is etching-processed while using the resist pattern 5p and the silicon oxide film pattern 4p as masks to form an organic film pattern 3p. The etching of the silicon oxide film 4 is performed by using F-based gas, and the etching of the organic film 3 is performed by using O-based gas. As illustrated in FIG. 1C, a structure where the organic film pattern 3p, the silicon oxide film pattern 4p, and the resist pattern 5p are stacked in this sequence is an example of the stacked mask structure 6.

When the antireflection film is formed on the silicon oxide film 4, the antireflection film is patterned prior to the etching of the silicon oxide film 4. A film thickness of the resist pattern 5p may be adjusted such that the resist pattern 5p disappears after the silicon oxide film pattern 4p is formed. A film thickness of the silicon oxide film pattern 4p may be adjusted such that the silicon oxide film pattern 4p disappears after the organic film pattern 3p is formed.

When the organic film pattern 3p is formed by the stacked mask structure 6 as shown in the present embodiment, the silicon oxide film pattern 4p and the resist pattern 5p being upper layers of the organic film pattern 3p are removed before the process of forming the mask pattern composed of the composite film by impregnating the metal compound into the patterned organic film (organic film pattern 3p) being the process of (3). Note, stated differently, the process of (3) is the process of forming the composite film by impregnating the metallic compound into the patterned organic film (organic film pattern 3p), to obtain the mask pattern composed of the composite film.

Figure 1D:
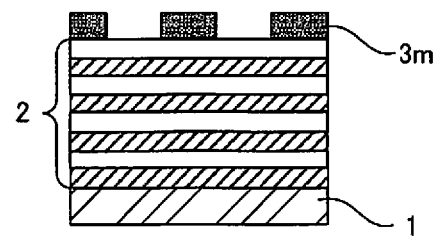
FIG. 1D is a view illustrating one process of the method of manufacturing the semiconductor device according to the embodiment.

FIG. 1D is a sectional view illustrating a state after the process of (3), and the organic film pattern 3p illustrated in FIG. 1C is metallized and exists on the target film 2 on the semiconductor substrate 1 as a mask pattern 3m. The metallization of the organic film pattern 3p is performed as, for example, described below.

A stack having the target film 2 and the organic film pattern 3p on the semiconductor substrate 1 in this sequence is carried into a vacuum device, the organic film pattern 3p is exposed to gas or liquid of a precursor such as TMA as a metal-containing fluid, and it is subjected to heat treatment at a temperature of 50° C. or more and less than 200° C. The treatment temperature is set to 50° C. or more, resulting in that molecules of the precursor can be more certainly impregnated into the polymer of the organic film pattern 3p. The treatment temperature is set to less than 200° C., resulting in that the molecules of the precursor can be adsorbed to the lone pair held by the polymer of the organic film pattern 3p, for example, the lone pair held by the carbonyl group.

The precursors which are used in a chemical vapor deposition (CVD) method and an atomic layer deposition (ALD) method can be used without particular limitation.

Examples of a metal contained in the precursor include aluminum, titanium, tungsten, vanadium, hafnium, zirconium, tantalum, molybdenum, and so on. Among an organometal compound of these metals and a halogenated compound of these metals, ones which have sufficiently small ligand can be used as the precursor.

Concretely, the usable precursor is able to contain at least any one of $AlCl_3$, $TiCl_4$, $WCl_6$, $VCl_4$, $HfCl_4$, $ZrCl_4$, TMA, $Ti(N(CH_3)_2)_4$, $Zr(N(CH_3)_2)_4$, $Hf(N(CH_3)_2)_4$, $Zr(O\text{---}CH_3)_4$, $Hf(O\text{---}CH_3)_4$, $Zr(O\text{---}C_4H_9)_4$, $Hf(O\text{---}C_4H_9)_4$, and so on. In the present embodiment, TMA is preferable.

After the precursor is adsorbed into the organic film pattern 3p, it is exposed in a water vapor atmosphere, and thereby, the precursor in the organic film pattern 3p is subjected to the oxidation treatment. The metal contained in the molecules of the precursor is thereby precipitated into the polymer as the metal compound. For example, when the precursor is TMA, the metal is precipitated into the polymer as aluminum oxide or the like. The oxidation treatment of the precursor is normally performed by using the oxidant such as water, ozone, oxygen plasma. The oxidation treatment of the precursor may be naturally carried out by moisture in the atmosphere without particular operation. The polymer forming the organic film pattern 3p is thereby metallized to be the mask pattern 3m formed of the composite film of the organic film and the metal compound.

Figure 1E:
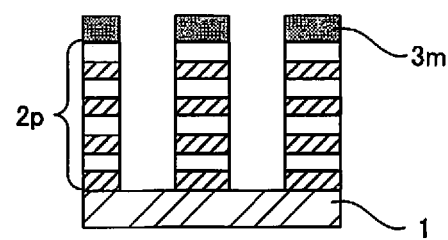
FIG. 1E is a view illustrating one process of the method of manufacturing the semiconductor device according to the embodiment.

Next, as illustrated in FIG. 1E, the target film 2 is etching-processed through RIE or the like while using the mask pattern 3m as a mask, to form a patterned target film 2p. The target film 2p having a process shape with a high aspect ratio is thereby formed.

After that, for example, a memory cell array is formed by using an already known method. For example, it is assumed that a hole pattern is formed at the stacked film through the above-stated processes. A memory structure can be formed by embedding a block layer, a charge storage layer, a tunnel layer, a channel layer, and a core layer in such a hole. After that, only the nitride film from among the stacked film is removed through a slit which is formed in addition to the hole pattern having the memory structure, and a conductive film is embedded alternatively. The stacked film where an insulating film (oxide film) and the conductive film are alternately stacked is thereby formed. The conductive film in the stacked film can be functioned as a word line.

Since the polymer material contains the polymer having the first monomer unit which has the lone pair and the aromatic ring at the side chain, the obtained organic film is easily metallized, and further has high etch resistance. It is thereby possible to obtain the mask pattern 3m with high etch resistance and to supply the process shape with high aspect ratio for the target film by using the polymer material.

When the polymer contained in the polymer material is the crosslinkable polymer including the second monomer unit having the crosslinking group at the terminal of the side chain in addition to the first monomer unit, it is possible to make the obtained organic film hardly soluble to the organic solvent by crosslinking the polymers when the organic film is formed. It is thereby possible to form an upper layer film such as a functional film or a precursor film on the organic film by applying or dropping the wet-coating liquid, and the like. At this time, mixing between the organic film and the upper layer film or the precursor film can be suppressed. Examples of the upper layer film or the precursor film include, for example, an SOC (spin on carbon) film, a TEOS (tetraethyl orthosilicate) film, a resist film, and so on in addition to the above-stated SOG film, and flexibility of design of the stacked mask structure dramatically increases.

According to the polymer material, the organic film can be formed by the methods such as the spin coating, the dip coating, and the vapor deposition. For example, in a carbon deposit layer and a DLC layer using a conventionally used CVD method, it takes a long time to form the film, but according to the polymer material, the organic film having the high etch resistance can be formed easily and in a short time. Note that the composition of the embodiment can be used in the case of the wet-coating method such as the spin coating and the dip coating.

In the above-stated embodiment, the monomer unit having the ester skeleton at the side chain is exemplified as the first monomer unit, but it is not limited thereto. A monomer unit having the ester skeleton at the main chain can be used as the first monomer unit. In this case, a plurality of continuously bonded ester skeletons form the main chain of the polymer.

In the above-stated embodiment, the example where the organic film pattern 3p is metallized in a gas phase is shown, but it is not limited thereto. The organic film pattern 3p may be metallized in a liquid phase.

In the above-stated embodiment, the structure mainly having the organic film 3, the silicon oxide film 4, and the resist pattern 5p is shown as the stacked mask structure, but it is not limited thereto. Various structures can be adopted as the stacked mask structure by inserting various films in addition to the above or deleting some of the above-stated films.

In the above-stated embodiment, the mask pattern 3m is formed on the semiconductor substrate 1, but it is not limited thereto. The mask pattern can be formed on substrates of glass, quartz, mica, and the like in addition to the semiconductor substrate of silicon or the like.

EXAMPLES

Hereinafter, examples are explained.

Examples 1 to 6

A polymer X formed of only a first monomer unit was fabricated through the following method, and an organic film was formed by using the obtained polymer X. A metallization property of the organic film and etch resistance of the metallized organic film were evaluated.

(Polymerization of Polymer X)

In the polymer X, phenylmethacrylate (PMA), phenylacrylate (PA), benzylmethacrylate (BMA), 4-acetoxystyrene (AcS), benzoylphenylacrylate (BPA) being marketed products were prepared as monomers to be the first monomer unit, and the polymer X was manufactured as described below.

Put 0.05 mol of PMA as a monomer and 0.005 mol of azobisisobutyronitrile (AIBN) as a polymerization initiator in a 100 cc round-bottomed flask, and add four times as much as a mass of PMA of anhydrous tetrahydrofuran (THF) as a polymerization solvent. After the air in the flask was nitrogen substituted, polymerization was performed at 60° C. for eight hours. After the polymerization was stopped by dropping a few spots of methanol, polymer components were reprecipitated in large excess methanol. The obtained polymer was dissolved in some amount of THF, and then the polymer was refined by reprecipitating the polymer again by using the large excess methanol again. The resultant was dried in vacuum for several days, to obtain desired polyphenylmethacrylate (PPMA).

Instead of PMA in the above, PA, BMA, AcS, BPA were respectively used to obtain respective homopolymers of polybenzylmethacrylate (PBMA), poly4-acetoxystyrene (PAcS), poly benzoyl phenyl acrylate (PBPA). Hereinafter, respective polymers are called polymers X-1 to X-5.

Results where a number-average molecular weight (Mn) and a weight-average molecular weight (Mw) of the obtained each polymer were measured by a gel permeation chromatography (GPC) method, and a result where a glass transition point (Tg) was measured by a differential scanning calorimetry (DSC) method are listed in Table 2 together with polymerization conditions. The Mn and the Mw of the polymer X-5 which was polymerized by using BPA were turned out to be drastically small compared to other polymers X-1 to X-4. It can be thought that a coating film of the polymer X-5 is a solid body, and the Tg is the room temperature or more. A polymer X-6 was obtained by performing polymerization similar to the above except that the polymerization solvent was changed into methylethylketone (MEK) and an amount of AIBN was changed into 0.05 mol regarding BPA. The Mn, Mw, and Tg are listed in Table 2.

[Evaluation]

A metallization property, heat resistance of an organic film and etch resistance of the metallized organic film were evaluated by using polymer materials 1 to 4 and a polymer material 6 respectively formed of the polymers X-1 to X-4 and X-6, and a polymer material cf1 formed of polystyrene (PS; Mw=20×10³ g/mol, Mn=19×10³ g/mol), and a polymer material cf2 formed of polymethylmethacrylate (PMMA; Mw=15×10³ g/mol, Mn=14×10³ g/mol) as comparative examples.

(Metallization Property)

The organic film was formed on an Si substrate by using each of the polymerization materials 1 to 4, the polymerization material 6, and the polymerization materials cf1, cf2, then metallization of the organic film was performed by using TMA to evaluate the metallization property.

The Si substrate (φ75 mm) which was subjected to UV treatment for three minutes was used. Each polymer material (polymer) was made into a 10 mass % PGMEA solution and applied on the Si substrate by the spin coating. A rotation number was adjusted to 2000 to 3500 rpm depending on a kind of the polymer, and after the applying, the solvent was removed by drying, to obtain organic films all with a thickness of approximately 300 nm. The obtained Si substrate with the organic film was cut into a 15 mm square piece, to be a sample for a metallization process.

The metallization was performed by using an atomic layer deposition (ALD) film-forming apparatus. Concretely, the metallization was performed in an exposure mode where the sample for the metallization process was set in the ALD apparatus, TMA in a gas phase was introduced into the apparatus up to a predetermined pressure, and then a valve was closed to retain the pressure in that state for a predetermined time. The pressure in the apparatus became gradually high as the time elapsed because TMA was decomposed to generate methane. TMA was coordinated to the lone pair held by the polymer X in the organic film through this operation. Exposure conditions by TMA were set to four kinds listed in the following Table 3. The pressure is an initial pressure.

After the exposure by TMA, the gas phase in the apparatus was substituted to water vapor (H₂O), the pressure was increased to a predetermined pressure, and the valve was closed to retain the pressure in that state for a predetermined time. The initial pressure was set to 300 Pa, and the retention time was set to 200 seconds. The temperature was the same as that of TMA. The pressure in the apparatus became

TABLE 2

| Polymer number | Monomer kind | Polymerization conditions ||||| Molecular weight (×10³ [g/mol]) || Tg [° C.] |
| | | Monomer amount [mol] | Solvent | AIBN amount [mol] | Temperature [° C.] | Time [hr] | Mw | Mn | |
| --- | --- | --- | --- | --- | --- | --- | --- | --- | --- |
| X-1 | PMA | 0.05 | THF | 0.005 | 60 | 8 | 30.0 | 17.0 | 127 |
| X-2 | PA | 0.05 | THF | 0.005 | 60 | 8 | 59.0 | 32.0 | 106 |
| X-3 | BMA | 0.05 | THF | 0.005 | 60 | 8 | 36.0 | 19.0 | 90 |
| X-4 | AcS | 0.05 | THF | 0.005 | 60 | 8 | 23.0 | 16.0 | 101 |
| X-5 | BPA | 0.05 | THF | 0.005 | 60 | 8 | 3.6 | 1.9 | 98 |
| X-6 | BPA | 0.05 | MEK | 0.05 | 60 | 8 | 83.0 | 29.0 | 133 | gradually low because $H_2O$ was consumed and adhered to a chamber inner wall. After the retention time under the state where $H_2O$ was filled was elapsed, the metallized sample for metallization was taken out of the apparatus. TMA was oxidized to be aluminum hydroxide or aluminum oxide by this operation. Metallization conditions are summarized and listed in Table 3. In Condition 1, TMA exposure and oxidation were alternately performed for five times each.

TABLE 3

| | TMA exposure conditions | | | | Oxidation conditions | | | |
|---|---|---|---|---|---|---|---|---|
| | Pressure [Pa] | Temperature [° C.] | Time [Second] | Number of times | Pressure [Pa] | Temperature [° C.] | Time [Second] | Number of times |
| Condition 1 | 60 | 100 | 300 | 5 | 300 | 100 | 200 | 5 |
| Condition 2 | 60 | 100 | 600 | 1 | 300 | 100 | 200 | 1 |
| Condition 3 | 60 | 140 | 600 | 1 | 300 | 140 | 200 | 1 |
| Condition 4 | 900 | 100 | 600 | 1 | 300 | 100 | 200 | 1 |

The ALD apparatus is used for the metallization process, but an object of the operation is to impregnate TMA into the polymer, and not to deposit an atomic layer on the substrate, that is, what is called the atomic layer deposition (ALD). Accordingly, the exposure time of the precursor becomes longer and the number of cycles is small compared to the normal ALD.

An index of a degree of metallization is an Al amount [atom %] per a unit volume of the metallized organic film measured by the XPS. Results are listed in Table 4 together with the metallization conditions. Numbers of the metallization conditions listed in Table 4 correspond to numbers of the conditions listed in Table 3.

(Etch Resistance)

Each substrate with the organic film (each substrate with the composite film) which was metallized was subjected to reactive ion etching (RIE) using $O_2$ gas or $CF_4$ gas. Film thicknesses of the composite film of each substrate with the composite film were measured by using the atomic force microscope (AFM) before and after the RIE, and an etching rate [nm/sec] was calculated using a difference between the film thicknesses before and after the RIE as an etching amount and an etching time. Results are listed in Table 4.

(1) $O_2$RIE $O_2$RIE was performed by using CI-300L (manufactured by Samco Inc.), under conditions of power: 50 W, bias 5 W, flow: 5 sccm, pressure: 3 Pa.

(2) $CF_4$RIE $CF_4$RIE was performed by using CI-300L, under conditions of power: 50 W, bias 10 W, flow: 5 sccm, pressure: 3 Pa.

TABLE 4

| Polymer material | | Metallization | Al amount | Etching rate [nm/sec] | |
|---|---|---|---|---|---|
| number | Monomer | conditions | [atom %] | $O_2$RIE | $CF_4$RIE |
| 1 | PMA | 1 | 12 | 0.027 | 0.255 |
| | | 2 | 10 | 0.028 | 0.26 |
| | | 3 | 10 | 0.027 | 0.25 |
| | | 4 | 15 | 0.024 | 0.244 |
| 2 | PA | 1 | 12 | 0.028 | 0.122 |
| | | 2 | 10 | 0.028 | 0.132 |
| | | 3 | 13 | 0.027 | 0.126 |
| | | 4 | 17 | 0.024 | 0.123 |
| 3 | BMA | 1 | 12 | 0.027 | 0.242 |
| | | 2 | 10 | 0.028 | 0.244 |
| | | 3 | 13 | 0.027 | 0.238 |
| | | 4 | 16 | 0.025 | 0.232 |
| 4 | AcS | 1 | 16 | 0.031 | 0.142 |
| | | 2 | 14 | 0.033 | 0.141 |
| | | 3 | 16 | 0.03 | 0.136 |
| | | 4 | 17 | 0.029 | 0.131 |
| 6 | BPA | 1 | 22 | 0.021 | 0.111 |
| | | 2 | 20 | 0.023 | 0.103 |
| | | 3 | 20 | 0.022 | 0.102 |
| | | 4 | 25 | 0.019 | 0.098 |
| cf1 | Styrene | 1 | 1 | 0.055 | 0.139 |
| | | 2 | 0 | 0.18 | 0.137 |
| | | 3 | 0 | 0.175 | 0.136 |
| | | 4 | 0 | 0.182 | 0.138 |
| cf2 | MMA | 1 | 13 | 0.032 | 0.182 |
| | | 2 | 10 | 0.035 | 0.194 |
| | | 3 | 12 | 0.03 | 0.188 |
| | | 4 | 16 | 0.033 | 0.175 |

It can be said that the polymer materials 1 to 4, 6 of Examples are excellent in the metallization property equal to or more than PMMA forming the polymer material cf2 from Table 4. There are tendencies that the metallization property is higher as the carbonyl group exists, and the degree of metallization increases as the pressure of TMA is higher and the time is longer.

The etch resistance for the $O_2$RIE dramatically improves as the degree of metallization increases. The etch resistance for the $O_2$RIE of the composite film using polystyrene (PS) forming the polymer material cf1 is low. The composite film using each of the polymer materials 1 to 4, 6 of Examples has the etch resistance for the $O_2$RIE which is higher than the composite film using PMMA when the metallization conditions are the same.

The etch resistance for the $CF_4$RIE is higher in the composite film using PS compared to PMMA. The composite film using the polymer X-2 (PPA) forming the polymer material 2 has high etch resistance for the $CF_4$RIE, and it was verified that the etch resistance improves up to a level exceeding the composite film using polystyrene (PS) forming the polymer material cf1. Further, when the polymer X-6 (PBPA) containing two benzene rings which have high etch resistance and two carbonyl groups which contribute to the metallization property per one monomer unit is used from among the polymers X forming these polymer materials, both the RIE resistance of the composite film and the metallization property of the organic film exerted high properties.

The $O_2$RIE resistance of the composite film using the polymer X-6 (PBPA) is at the same level as the composite film using PS, and the high RIE resistance was exerted resulting from the high content of the benzene ring. Since the polymer X-6 (PBPA) has two carbonyl groups, the degree of metallization is high, and the composite film with high $O_2$RIE resistance can be obtained by using the polymer X-6 (PBPA). Concretely, a film-thickness reduction was hardly observed (385 nm→383 nm) through the $O_2$RIE for 900 seconds. The $CF_4$RIE resistance of the composite film using the polymer X-6 (PBPA) is high, and the etching rate is approximately a half of the composite film using PMMA which forms the polymer material cf2 which was metallized under the same conditions.

In summary, the organic film using each of the polymer materials 1 to 4, 6 of Examples is excellent in the metallization property equivalent to or more than the organic film using PMMA. It can be seen that the composite film using each of the polymer materials 1 to 4, 6 of Examples is higher in both of or one of the etch resistance for the $O_2$RIE and the etch resistance for the $CF_4$RIE compared to the composite film using PS and the composite film using PMMA.

When the polymer X-6 (PBPA) was used in the wet-coating method as the composition together with the solvent, the applying property was also good.

Reference Example

A design method of a polymer when a crosslinking group is introduced into the polymer and an organic film is insolubilized with respect to a solvent is explained while using PMMA as an example.

In the metallization process, it is assumed that the SOG film or the like is formed on the organic film by the wet-coating method. In this case, there is an advantage that a wet-coating liquid to form the SOG film can be directly applied on the organic film if the organic film is insolubilized with respect to the solvent by crosslinking the polymers at the formation time of the organic film. Meanwhile, the precursor is necessary to be diffused and fixed in the polymer so that the metallization proceeds. At this time, it is known that the precursor does not enter the polymer if a crosslink density is too high.

When the crosslink density is too high, the metallization becomes difficult because the diffusion of the precursor such as TMA is disturbed at the metallization time, and when the crosslink density is low, the solvent resistance cannot be obtained. In order to find a quantitative relation between the crosslink density and a precursor adsorption amount, P(MMA-r-GMA) (where "-r-" represents to be a random copolymer) where glycidylmethacrylate (GMA) is contained at a ratio of each of 1 mol %, 2 mol %, 5 mol % or 10 mol % with respect to a whole amount of GMA and methylmethacrylate (MMA) was polymerized in a copolymer formed of GMA containing the glycidyl group being the crosslinking group and MMA. Molar ratios of MMA and GMA in the obtained P(MMA-r-GMA) by the NMR measurement were the same as they were prepared.

First, the citric acid was used as the curing agent (carboxylic acid) of GMA to see a relation between the crosslink density and the solvent resistance. As it was expected, the solvent resistance for PGMEA became higher as an annealing temperature became higher. It is said that a reaction between the glycidyl group and the carboxylic acid gradually goes on even at the room temperature. However, the solvent resistance was low when the annealing temperature was low. In such a circumstance, the copolymer with 10 mol % GMA was largely insolubilized at 100° C. The copolymer with 2 mol % or more GMA was completely insolubilized at 180° C. or more. The copolymer with 1 mol % GMA did not reach the insolubilized state though a velocity of dissolution became slow. It turned out from the above that 2 mol % or more of the crosslinking group was necessary to completely form networking by the crosslinking.

It was verified from the above that 2 mol % or more of the crosslinking group was necessary so as to exert the solvent resistance. A threshold value of the solvent resistance can be thought similar to the percolation theory, and a concentration is expected to be not largely numerically different also in other polymers. Accordingly, 2 mol % of the crosslinking group is necessary so as to exert the solvent resistance at a complete crosslinking time, but actually, it is expected that the required concentration of the crosslinking group is slightly larger than this value due to reaction disturbance, and the like.

Since the crosslinked polymers are in a meshed state, it can be thought that the diffusion of the precursor is disturbed when a mesh is dense. It becomes difficult to obtain both the solvent resistance and the metallization property depending on a degree of crosslinking which causes disturbance of diffusion. Accordingly, an upper limit value of the crosslink density where the metallization was possible was experimentally found by conducting a metallization experiment using TMA.

Detailed measurements regarding the metallization property and the solvent resistance were performed by using P(MMA-r-GMA) where the concentration (molar ratio) of GMA was set at 0.5 mol % to 10 mol %. Concretely, a composition where the citric acid as the curing agent (carboxylic acid) was added to P(MMA-r-GMA) each having different GMA concentrations for the same amount of mol as the concentration of GMA, and dissolved into PGMEA was prepared. The composition was applied on a Si substrate by the spin coating, and an organic film (approximately 300 nm thickness) was formed by subjecting to annealing at 220° C. for 10 minutes. It is thought that GMA and the citric acid are almost completely crosslinked under the annealing conditions.

Figure 2:
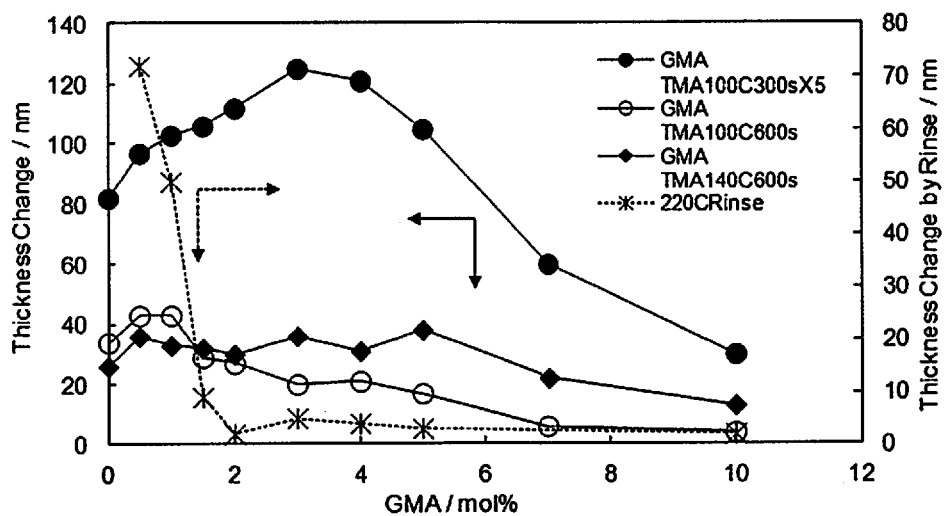
FIG. 2 is a graphic chart illustrating a relation between an introduction amount of a crosslinking group, and solvent resistance and a metallization degree in a crosslinkable polymer of Reference Examples.

Next, the obtained organic film was subjected to the metallization process. The conditions of the metallization were set to Condition 1 to Condition 3 in Table 3. Film thicknesses of the organic film before and after the metallization were measured by using the atomic force microscope (AFM), and a difference between the film thicknesses before and after the metallization was set as a metallization amount. Treatment, where the Si substrate with the organic film before the metallization was subjected to heat treatment at 220° C. for 10 minutes and then immersed into PGMEA for 30 seconds, was repeated three times (hereinafter, called PGMEA rinse), and film thicknesses before and after the PGMEA rinse were measured by the AFM to find a change amount. Results thereof are illustrated in FIG. 2. In FIG. 2, a mark "●" represents a case when the metallization was performed under Condition 1, a mark "○" represents a case when the metallization was performed under Condition 2, and a mark "◆" represents a case when the metallization was performed under Condition 3. A mark "*" represents the change amount by the PGMEA rinse.

As illustrated in FIG. 2, when the molar ratio of GMA in the polymer was 1.5 mol %, the polymer was almost insolubilized, but swelling was recognized during the PGMEA rinse. When the molar ratio of GMA in the polymer was 2 to 5 mol %, dependency was found between the annealing temperature and the mol concentration of GMA at a region where the annealing temperature was low. That is, a lower limit value capable of forming a network is the molar ratio of GMA of 2 mol %, and it is thought that the value corresponds to a critical point where a network can be formed in the percolation theory. When the molar ratio of GMA in the polymer is in a region of 2 to 5 mol %, it is thought that the organic film dissolves when the concentration of the crosslinking group after reaction becomes lower than 2 mol %. The critical point (in this case, 2 mol % when the molecular weight is 30000) is theoretically considered to be independent of the kind of the polymer as long as the molecular weight is the same, and therefore, only disturbing factors of the reaction are necessary to be considered.

When the molar ratio of GMA in the polymer was 5 mol % or less, an increase in the film thickness due to the adsorption of TMA was remarkably recognized. When each of the cases when the molar ratios of GMA in the polymer were 7 mol %, 10 mol %, the increase in the film thickness was small, and it can be thought that the crosslink density is high and the diffusion disturbance of TMA occurs in these molar ratios of GMA. Further, when a molecular model when the molar ratio of GMA in the polymer is 5 mol % is calculated by molecular dynamics (MM), it can be seen that there are gaps where the dimers of TMA can pass through. A size of a ring is slightly large with respect to the TMA dimer, but it is possible to explain from a relation between v and v* of a diffusion theory in consideration of a peripheral environment.

It can be seen from the above that the molar ratio of GMA in the polymer capable of exerting the solvent resistance is preferably 2 mol % or more, and the preferable molar ratio in the metallization is 5 mol % or less. It is thought that there is no dependency on the polymer kind in this relation from mechanisms of the dissolution and the diffusion. Note that a decrease of the crosslinking point due to the crosslinking reaction disturbance can be thought. In this case, it is only required to scale at the crosslinked point, and therefore, the crosslinking group such as the glycidyl group of GMA is to be shifted to a larger side as it is.

In a combination between the glycidyl group which is built in a polymer chain and the low-molecular-weight citric acid, the crosslinking is not completed unless one molecule forms two-point bonding. On the other hand, the crosslinking is completed by one-point bonding between high molecules. Since the reaction between the glycidyl group and the citric acid gradually progresses even at the room temperature, there is a difficulty in practical use. It is therefore considered to be better to perform the reaction and the crosslinking after the film is formed between the high molecules with each other. Under this concept, a system where t-butylmethacrylate (t-BMA) is built into the polymer is examined.

A polymer of P(MMA-r-t-BMA) was additionally synthesized and mixed with the already synthesized P(MMA-r-GMA) at a ratio such that t-BMA and GMA became the same mol, and a composition where the resultant was dissolved in PGMEA was prepared. After the composition was applied on the Si substrate by the spin coating, it was subjected to annealing at 220° C. for 10 minutes to obtain an Si substrate with an organic film while simultaneously advancing conversion of t-BMA into the methacrylic acid due to a deprotection reaction and the crosslinking reaction between the methacrylic acid and glycidyl group. Note that t-BMA is thermally decomposed at 160° C. or more to be the methacrylic acid.

The solvent resistance of the organic film of the obtained Si substrate with the organic film with respect to the PGMEA rinse was slightly worse compared to the low-molecular-weight citric acid. However, it is considered that there is little difference involving an error because the quantity changed slightly from 2 mol % to 3 mol %. It is thought that a reaction efficiency of the crosslinking is lowered because the deprotection reaction of t-BMA and the crosslinking reaction are simultaneously performed.

Further, P(MMA-r-t-BMA-r-GMA) formed of GMA, MMA, and t-BMA was synthesized as a polymer having both the glycidyl group and the group formable the carboxylic acid in the polymer. Molar ratios of t-BMA and GMA with respect to the whole amount of the monomer unit are each 2 mol %. An organic film is fabricated by using this polymer, and the solvent resistance was checked through the PGMEA rinse. As a result, the solvent resistance was actually exerted through the annealing when the annealing temperature was 220° C. or more. This is proper because the reaction proceeds in a sequence of the decomposition of t-BMA→generation of the methacrylic acid→the crosslinking with the glycidyl group. It turned out that a required reaction temperature is higher in the high-molecular one compared to the low-molecular one even when the molar ratios are the same to be 2 mol %. This is also a proper result from the diffusion theory.

Examples 7 to 9

A crosslinkable polymer X (P(BPA-r-GMA)) where the crosslinking group is introduced into PBPA being the polymer X by using GMA was synthesized based on the test result in Reference Examples, then an organic film where the solvent resistance was supplied was fabricated by using the crosslinkable polymer to be evaluated.

(Polymerization of Crosslinkable Polymer X)

Crosslinkable polymers X-11 to X-13 were polymerized while using BPA as a component monomer of the first monomer unit and GMA as a component monomer of the second monomer unit under polymerization conditions listed in Table 5. Yields of the obtained polymers X-11 to X-13 were approximately 90%. The Mn, the Mw, and the Tg of each polymer are also listed in Table 5.

TABLE 5

| Polymer number | Monomer molar ratio [mol %] | | Whole monomer amount [mol] | Solvent | AIBN amount [mol] | Temperature [° C.] | Time [hr] | Molecular weight (×10³) [g/mol]) | | Tg [° C.] |
|---|---|---|---|---|---|---|---|---|---|---|
| | BPA | GMA | | | | | | Mw | Mn | |
| X-11 | 98 | 2 | 0.05 | MEK | 0.005 | 60 | 8 | 79 | 32 | 133 |
| X-12 | 95 | 5 | 0.05 | MEK | 0.005 | 60 | 8 | 83 | 29 | 133 |
| X-13 | 90 | 10 | 0.05 | MEK | 0.005 | 60 | 8 | 79 | 21 | 132 |

[Evaluation]
(1) Solvent Resistance
Polymer materials 7 to 9 were prepared by adding the citric acid as the curing agent (carboxylic acid) for the same amount of mol as the concentration of GMA to the polymers X-11 to X-13, and compositions, where the polymer materials 7 to 9 were dissolved in PGMEA, were prepared as same as Reference Examples. Concentrations of the polymer materials 7 to 9 were each adjusted to be 10 mass % with respect to the whole amount of the composition. Each composition was applied on an Si substrate by the spin coating, and the resultant was subjected to the annealing at 220° C. or 250° C. for 10 minutes to form an organic film (approximately 300 nm thickness). The obtained Si substrate with the organic film was subjected to the PGMEA rinse to examine the solvent resistance.

As a result, the organic film obtained by using the polymer X-11 was observed the film-thickness reductions of 10 nm when the annealing temperature was 220° C., and 35 nm when the annealing temperature was 250° C., and the organic film obtained by using the polymer X-12 was observed the film-thickness reductions of 50 nm when the annealing temperature was 220° C., and 25 nm when the annealing temperature was 250° C. It was verified that the film-thickness reduction does not occur in the organic film obtained by using the polymer X-13, and it is excellent in the solvent resistance. In the organic film obtained by using the polymer X-6, since the film-thickness was reduced for 5 nm when the annealing temperature was 220° C. by the similar test, it turned out that the solvent resistance was improved in the crosslinkable polymer X where the second monomer unit was introduced.

(2) Metallization Property and Solvent Resistance
A polymer P(BPA-r-GMA) was fabricated by using BPA as a component monomer of the first monomer unit and GMA as a component monomer of the second monomer unit and setting the concentration (molar ratio) of GMA at 0.5 mol % to 10 mol %, and the metallization property and the solvent resistance were precisely measured. Concretely, the citric acid as the curing agent (carboxylic acid) was added for the same amount of mol as the concentration of GMA to each of the polymers P(BPA-r-GMA) having different GMA concentrations, and compositions where the resultants were dissolved into PGMEA were prepared. Each composition was applied on an Si substrate by the spin coating, and the resultant was subjected to the annealing at 220° C. for 10 minutes to form an organic film (approximately 300 nm thickness). It is thought that GMA and the citric acid are approximately completely crosslinked under this annealing condition.

Figure 3:
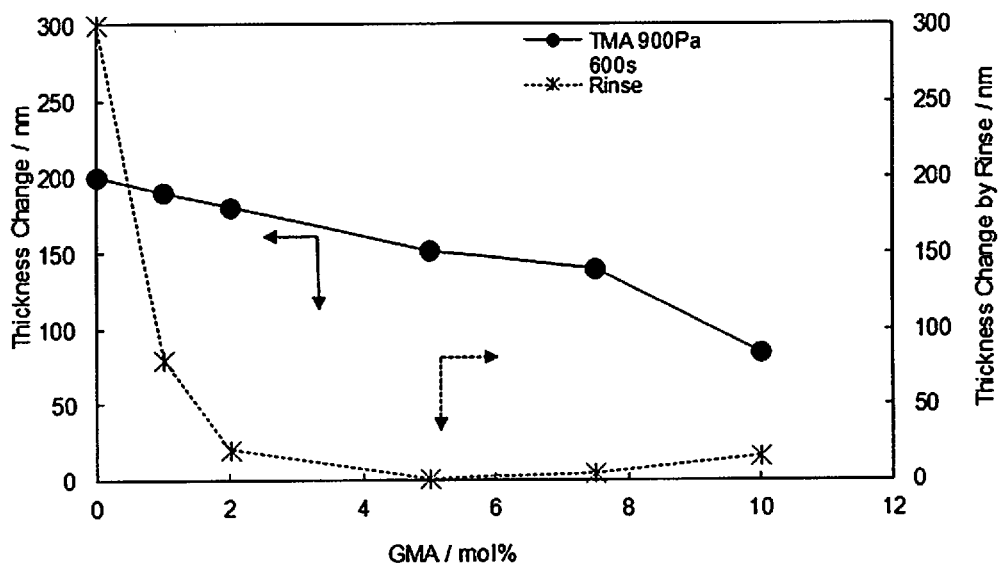
FIG. 3 is a graphic chart illustrating a relation between an introduction amount of a crosslinking group, and solvent resistance and a metallization degree in a crosslinkable polymer of Examples.

Next, the obtained organic film was subjected to the metallization process. Condition 4 in Table 3 was used as the metallization condition. Film-thicknesses of the organic film before and after the metallization were measured by using the atomic force microscope (AFM), and a difference between the film-thicknesses before and after the metallization was set as a metallization amount. Treatment, where the Si substrate with the organic film before the metallization was subjected to heat treatment at 220° C. for 10 minutes and then immersed into PGMEA for 30 seconds, was repeated three times (PGMEA rinse), and film thicknesses before and after the PGMEA rinse were measured by the AFM to find a change amount. Results are illustrated in FIG. 3. In FIG. 3, a mark "●" represents the change amount when the metallization was performed under Condition 4, and a mark "*" represents the change amount by the PGMEA rinse.

It can be seen from FIG. 3 that the molar ratio of GMA in the polymer exerting the solvent resistance is preferably 2 mol % or more, and the preferable molar ratio in the metallization is 5 mol % or less.

Example 10

An example where the third monomer unit was introduced into the crosslinkable polymer X having the glycidyl group as the crosslinking group was examined. First, a polymer P(BPA-r-t-BMA) where a thermally decomposable t-butyl group being a partner of the glycidyl group was introduced into PBPA was polymerized under conditions in Table 6 to obtain polymers X-21 to X-23. The Mn, the Mw, and the Tg of the polymers X-21 to X-23 are also listed in Table 6.

TABLE 6

| | Polymerization conditions | | | | | | | Molecular weight ($\times 10^3$ [g/mol]) | | Tg |
|---|---|---|---|---|---|---|---|---|---|---|
| | Monomer content ratio [mol %] | | Whole monomer amount | | AIBN amount | | | | | |
| Polymer number | BPA | t-BMA | [mol] | Solvent | [mol] | Temperature [° C.] | Time [hr] | Mw | Mn | [° C.] |
| X-21 | 98 | 2 | 0.05 | MEK | 0.005 | 60 | 8 | 74 | 26 | 132 |
| X-22 | 95 | 5 | 0.05 | MEK | 0.005 | 60 | 8 | 79 | 28 | 132 |
| X-23 | 90 | 10 | 0.05 | MEK | 0.005 | 60 | 8 | 67 | 16 | 130 |

A polymer material 10 was prepared by mixing the polymer X-21 and the polymer X-11 to have a mole ratio of 1:1, and a composition where the polymer material 10 was dissolved into PGMEA was prepared. A concentration of the polymer material 10 was adjusted to be 10 mass % with respect to a whole amount of the composition. The composition was applied on an Si substrate by the spin coating, and the resultant was subjected to annealing at 220° C. or 250° C. for 10 minutes to form an organic film (approximately 300 nm thickness). The obtained Si substrate with the organic film was subjected to the PGMEA rinse to examine the solvent resistance.

As a result, a film-thickness reduction of 15 nm when the annealing temperature was 220° C., and 30 nm when the annealing temperature was 250° C. were observed in the obtained organic film. It turns out that the organic film obtained from the polymer material 10 has the solvent resistance. The obtained Si substrate with the organic film was subjected to the metallization under Condition 4 in Table 3. As a result, an Al content was 24 atom % to be approximately the same degree as PBPA which was not crosslinked though it was crosslinked.

Compositions were prepared similar to the above regarding a combination of the polymer X-22 and the polymer X-12, and a combination of the polymer X-23 and the polymer X-13 instead of the combination of the polymer X-21 and the polymer X-11, Si substrates each with an organic film were respectively fabricated, further they were subjected to the metallization under Condition 4 in Table 3. In the combination of the polymer X-22 and the polymer X-12, the Al content was 22 atom %, but in the combination of the polymer X-23 and the polymer X-13, the Al content was decreased to 12 atom %. It can be seen from the above that when the crosslink density is up to approximately 5 mol %, that is, a ratio of the monomer unit of BPA in the whole polymer is not below approximately 95 mol %, the metallization is the same level as the metallization without crosslinking.

An organic film fabricated similar to the above (note that the annealing temperature was 250° C.) by using the polymer material 10 was used as a base film, a wet-coating liquid for an SOG film was further applied thereon, to form the SOG film. The SOG film becomes a silicon oxide film by subjecting to annealing at 200° C. or more, and is used as a hard mask in a subsequent process. A resist film for ArF light was further formed thereon, and the resultant was subjected to patterning, by an ArF exposure to obtain a resist pattern.

After the silicon oxide film was subjected to patterning by using fluorine-based gas through the RIE while using the resist pattern as a mask, then the organic film obtained from the polymer material 10 was subjected to the RIE by using oxygen-based gas while using the obtained silicon oxide film pattern as a mask. As a result, the resist pattern could be transferred to the organic film.

Next, an apparatus having the same constitution as the ALD apparatus was used, and the metallization was performed with the TMA gas. The metallization condition was Condition 4 in Table 3. As a result, a mask pattern formed of the organic film (composite film) containing the metal compound could be obtained. This mask pattern had extremely high etch resistance and exerted the etch resistance of 1.5 times as much as a diamond carbon (DLC) film even under a highly-biased RIE condition for a three-dimensional device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A composition comprising:
    a polymer material including a polymer containing a first monomer unit having a lone pair and an aromatic ring at a side chain, and a second monomer unit including a crosslinking group at a terminal of the side chain, with its molar ratio of 0.5 mol % to 10 mol % to all monomer units in the polymer, the polymer material to be impregnated with 10 atom % or more of a metal, and
    a solvent.
2. The composition according to claim 1, wherein a molar ratio of the first monomer unit to all monomer units in the polymer is 30 mol % to 99.5 mol %.
3. The composition according to claim 1, wherein a main component monomer of the polymer is a (meth)acrylate, and
    a component monomer of the first monomer unit is an aromatic compound derivative of a (meth)acrylic acid.
4. The composition according to claim 1, wherein the first monomer unit has two or more lone pair at a side chain.
5. The composition according to claim 1, wherein the crosslinking group includes a glycidyl group.
6. The composition according to claim 1, wherein the second monomer unit has the molar ratio of 1 mol % to 7 mol % to all monomer units in the polymer.
7. The composition according to claim 1, wherein the second monomer unit has the molar ratio of 2 mol % to 5 mol % to all monomer units in the polymer.
8. The composition according to claim 1, wherein the first monomer unit has the lone pair contained in a ester bond (—COO—), a cyano group (—C≡N), a pyridine skeleton, and an amino group (—NH2).
9. The composition according to claim 1, wherein the polymer contains a third monomer unit including a group formable a carboxyl group due to heating or light irradiation at the terminal of the side chain.
10. The composition according to claim 9, wherein a molar ratio of the third monomer unit to all monomer units in the polymer is 0.2 mol % to 50 mol %, and
    a molar ratio of the first monomer unit to all monomer units in the polymer is 49.5 mol % to 99.3 mol %.

* * * * *